United States Patent
Jung et al.

(10) Patent No.: US 11,991,916 B2
(45) Date of Patent: May 21, 2024

(54) ALLOY METAL PLATE AND DEPOSITION MASK INCLUDING ALLOY METAL PLATE

(71) Applicant: LG INNOTEK CO., LTD., Seoul (KR)

(72) Inventors: Hyun Joon Jung, Seoul (KR); Woo Young Chang, Seoul (KR); Duck Hoon Park, Seoul (KR); Jee Heum Paik, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 497 days.

(21) Appl. No.: 17/274,487

(22) PCT Filed: Nov. 6, 2019

(86) PCT No.: PCT/KR2019/014939
§ 371 (c)(1),
(2) Date: Mar. 9, 2021

(87) PCT Pub. No.: WO2020/105910
PCT Pub. Date: May 28, 2020

(65) Prior Publication Data
US 2021/0313515 A1 Oct. 7, 2021

(30) Foreign Application Priority Data

Nov. 19, 2018 (KR) .................. 10-2018-0142628
Nov. 20, 2018 (KR) .................. 10-2018-0143405

(51) Int. Cl.
*C22C 38/08* (2006.01)
*C23C 14/04* (2006.01)
(Continued)

(52) U.S. Cl.
CPC ........... *H10K 71/166* (2023.02); *C22C 38/08* (2013.01); *C23C 14/042* (2013.01); *C23C 14/24* (2013.01); *H10K 71/00* (2023.02); *H10K 71/164* (2023.02)

(58) Field of Classification Search
CPC ...... C22C 38/08; C22C 38/105; C23C 14/042; C23C 14/24–325; H10K 71/166; H10K 71/621; H10K 71/164
See application file for complete search history.

(56) References Cited

U.S. PATENT DOCUMENTS 1,053,324 A 2/1913 Sleezer
6,229,255 B1 5/2001 Kim et al.
(Continued)

FOREIGN PATENT DOCUMENTS

CN 106460150 2/2017
CN 107709601 2/2018
(Continued)

OTHER PUBLICATIONS

Hideyuki, EP 3705600 A1, 2020, translation (Year: 2020).*
(Continued)

*Primary Examiner* — Marcos D. Pizarro
*Assistant Examiner* — William Henry Anderson
(74) *Attorney, Agent, or Firm* — KED & ASSOCIATES, LLP

(57) ABSTRACT

In an alloy metal plate according to an embodiment, diffraction intensity of a (111) plane of the alloy metal plate is defined as I (111), diffraction intensity of a (200) plane of the alloy metal plate is defined as I (200), diffraction intensity of a (220) plane of the alloy metal plate is defined as I (220), a diffraction intensity ratio of I (200) is defined by the following Equation 1, and a diffraction intensity ratio of I (220) is defined by the following Equation 2. At this time, the A is 0.5 to 0.6, the B is 0.3 to 0.5, and the value A may be larger than a value B.

$A = I(200)/\{I(200)+I(220)+I(111)\}$  [Equation 1]

The diffraction intensity ratio of I (220) is defined by the following Equation 2.

(Continued)

$$B = I(220)/\{I(200)+I(220)+I(111)\} \quad \text{[Equation 2]}$$

In addition, in an iron (Fe)-nickel (Ni) alloy metal plate of a deposition mask for OLED pixel deposition according to an embodiment, the metal plate is formed of a plurality of crystal grains, and the maximum area of the crystal grains measured over the entire area of the metal plate is 700 μm² or less.

10 Claims, 21 Drawing Sheets

(51) Int. Cl.
    *C23C 14/24*     (2006.01)
    *H10K 71/00*     (2023.01)
    *H10K 71/16*     (2023.01)

(56) References Cited

U.S. PATENT DOCUMENTS

| | | | |
|---|---|---|---|
| 10,096,684 B2 | 10/2018 | Hosaka et al. | |
| 10,509,145 B2 | 12/2019 | Park et al. | |
| 10,535,742 B2 | 1/2020 | Hosaka et al. | |
| 10,570,498 B2 | 2/2020 | Ikenaga et al. | |
| 10,612,124 B2 | 4/2020 | Ikenaga et al. | |
| 11,063,125 B2 | 7/2021 | Hosaka et al. | |
| 2016/0145762 A1* | 5/2016 | Im | C25D 1/10 205/70 |
| 2017/0108621 A1 | 4/2017 | Park et al. | |
| 2017/0186843 A1 | 6/2017 | Hosaka et al. | |
| 2017/0198383 A1 | 7/2017 | Chang et al. | |
| 2018/0023182 A1 | 1/2018 | Ikenaga et al. | |
| 2019/0051727 A1 | 2/2019 | Hosaka et al. | |
| 2019/0161848 A1 | 5/2019 | Ikenaga et al. | |
| 2019/0185984 A1* | 6/2019 | Huang | C23C 14/12 |
| 2019/0259951 A1 | 8/2019 | Seong et al. | |
| 2020/0017951 A1* | 1/2020 | Ikenaga | C21D 1/76 |
| 2020/0161435 A1 | 5/2020 | Hosaka et al. | |
| 2021/0343843 A1 | 11/2021 | Hosaka et al. | |

FOREIGN PATENT DOCUMENTS

| | | | |
|---|---|---|---|
| CN | 108473334 | 8/2018 | |
| CN | 108701776 | 10/2018 | |
| DE | 102016119623 | 4/2017 | |
| EP | 3288097 | 2/2018 | |
| EP | 3680949 A2 * | 7/2020 | ............ B23P 15/00 |
| EP | 3705600 A1 * | 9/2020 | ........... B05C 21/005 |
| JP | H01-247558 | 10/1989 | |
| JP | 09-137220 | 5/1997 | |
| JP | H 11-189846 | 7/1999 | |
| JP | 2000-011910 | 1/2000 | |
| JP | 2001-262231 | 9/2001 | |
| JP | 2014-101543 | 6/2014 | |
| JP | 2017-125253 | 7/2017 | |
| JP | 2018-513918 | 5/2018 | |
| KR | 10-1999-0080692 | 11/1999 | |
| KR | 10-2002-0016444 | 3/2002 | |
| KR | 10-0830321 | 5/2008 | |
| KR | 10-2017-0112673 | 10/2017 | |
| KR | 10-2017-0112810 | 10/2017 | |
| KR | 10-2018-0029796 | 3/2018 | |
| KR | 20180049463 | 5/2018 | |
| KR | 10-2018-0089607 | 8/2018 | |
| KR | 20200027253 A * | 3/2020 | ............... C23F 1/02 |
| KR | 10-1724996 | 10/2021 | |
| TW | 201832392 | 9/2018 | |
| WO | WO 2016/171337 | 10/2016 | |
| WO | WO 2017142231 | 8/2017 | |
| WO | WO-2017142231 A1 * | 8/2017 | ............. C22C 38/08 |
| WO | WO 2018/052197 | 3/2018 | |
| WO | WO-2019103319 A1 * | 5/2019 | ............. C22C 38/40 |

OTHER PUBLICATIONS

Bum, WO 2017142231 A1, 2017, translation (Year: 2017).*
Translation of EP-3680949-A2 (Year: 2020).*
Translation of WO-2019103319-A1 (Year: 2019).*
Translation of KR-20200027253-A (Year: 2020).*
Chinese Office Action dated May 31, 2023 issued in Application No. 201980069822.6.
European Search Report dated Jun. 20, 2022 issued in Application No. 19887448.9.
Japanese Office Action dated Dec. 26, 2022 issued in Application No. 2021-518143.
Korean Office Action dated Feb. 20, 2023 issued in Application No. 10-2018-0142628.
Japanese Third Party Observations dated Apr. 13, 2022 issued in Application No. 2021-518143.
International Search Report dated Feb. 18, 2020 issued in Application No. PCT/KR2019/014939.
Korean Office Action issued in Application No. 10-2018-0143405 dated Sep. 5, 2023.
Taiwanese Office Action dated Nov. 8, 2023 issued in Application No. 1122112294001.
Korean Office Action dated Dec. 20, 2023 issued in Application No. 10-2018-0142628.
Japanese Office Action dated Mar. 5, 2024, issued in Application No. 2023-065574.

* cited by examiner

[FIG. 1]
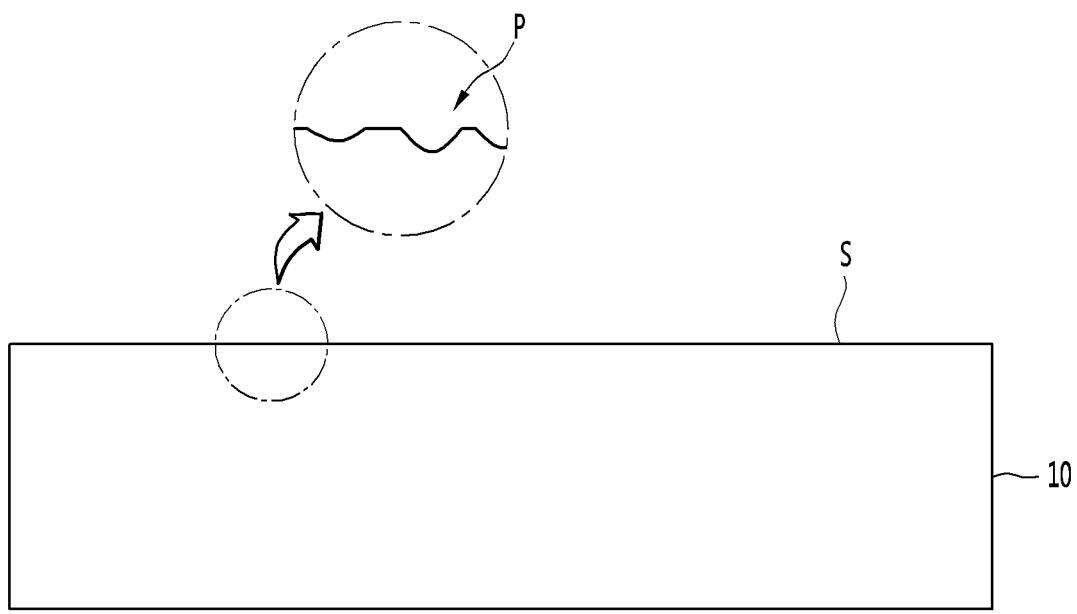

[FIG. 2]
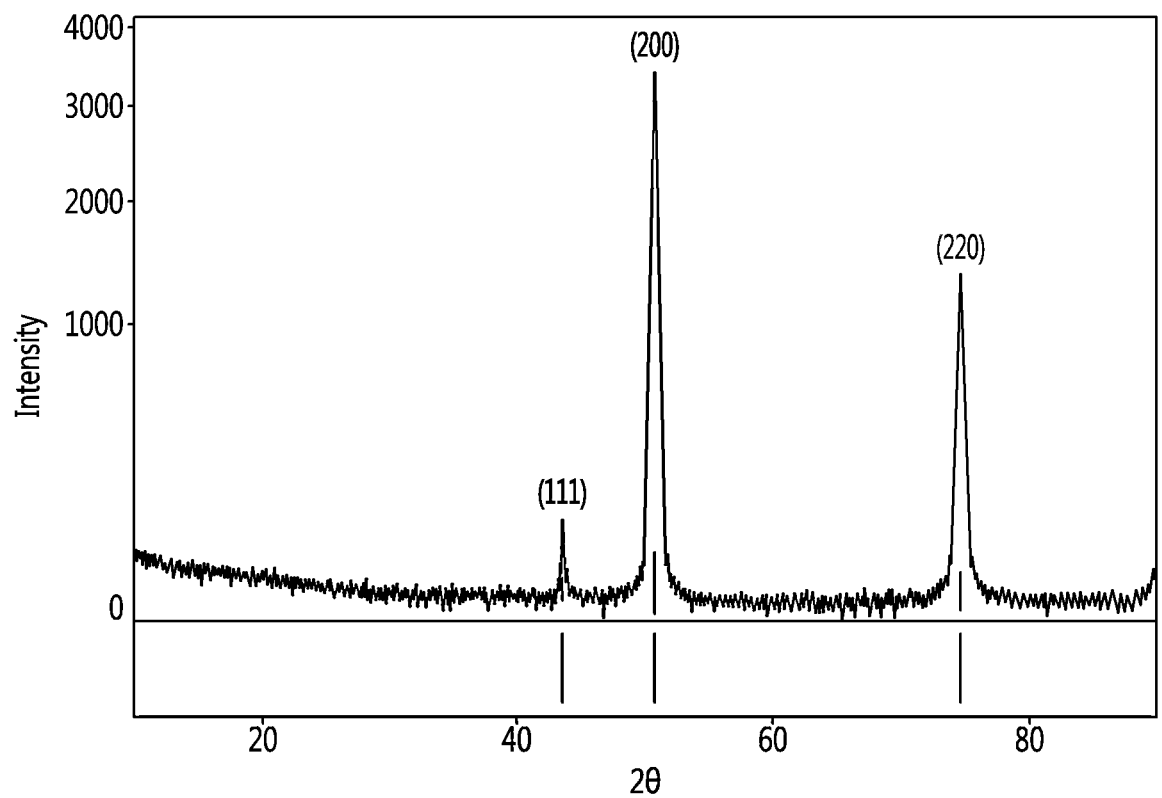

[FIG. 3]
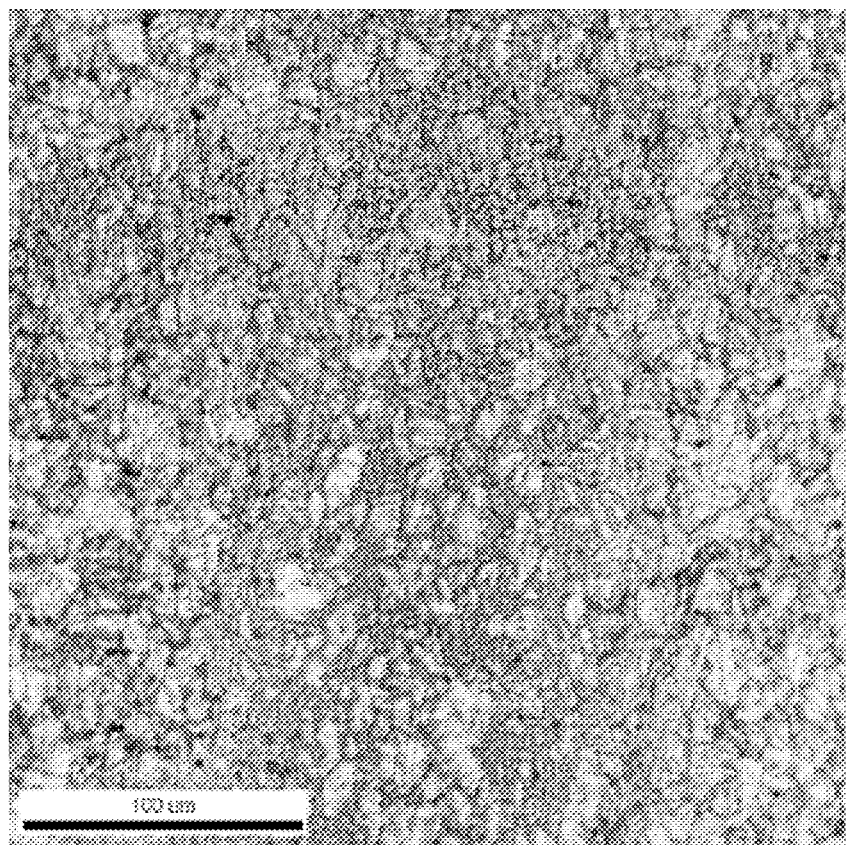

[FIG. 4]
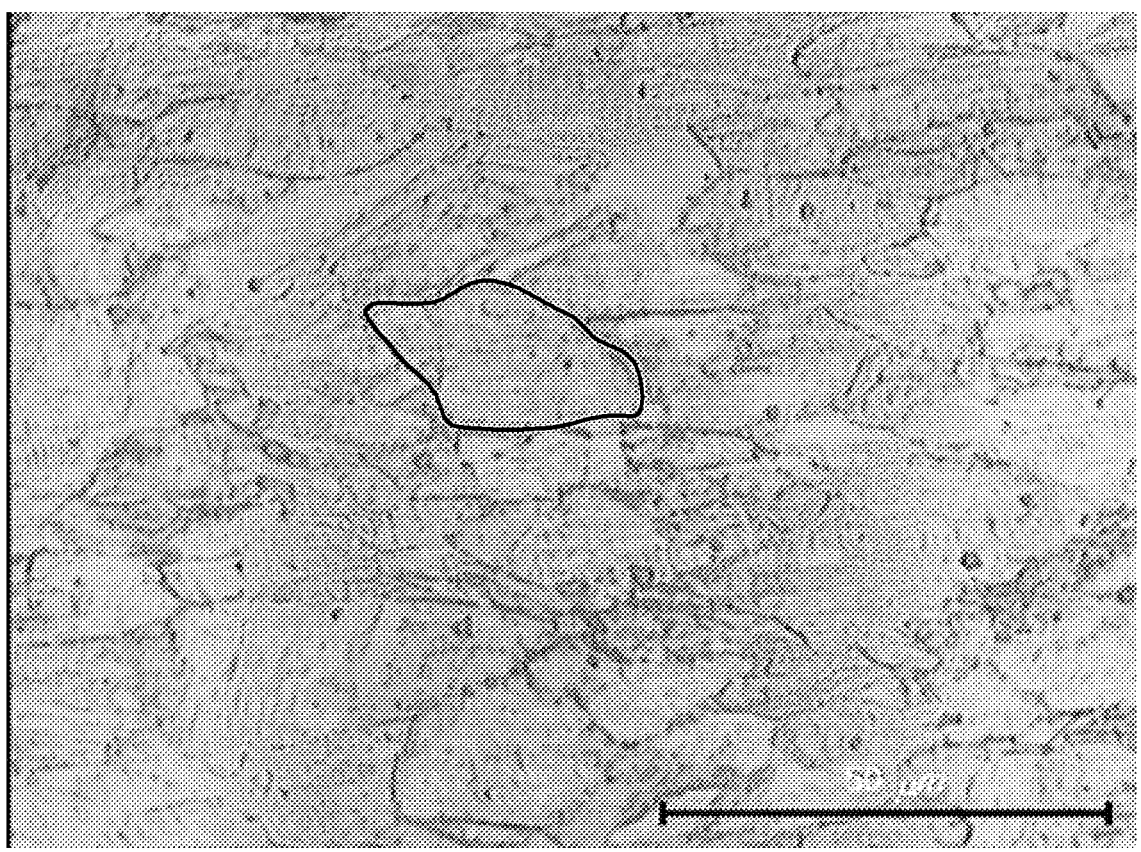

[FIG. 5]
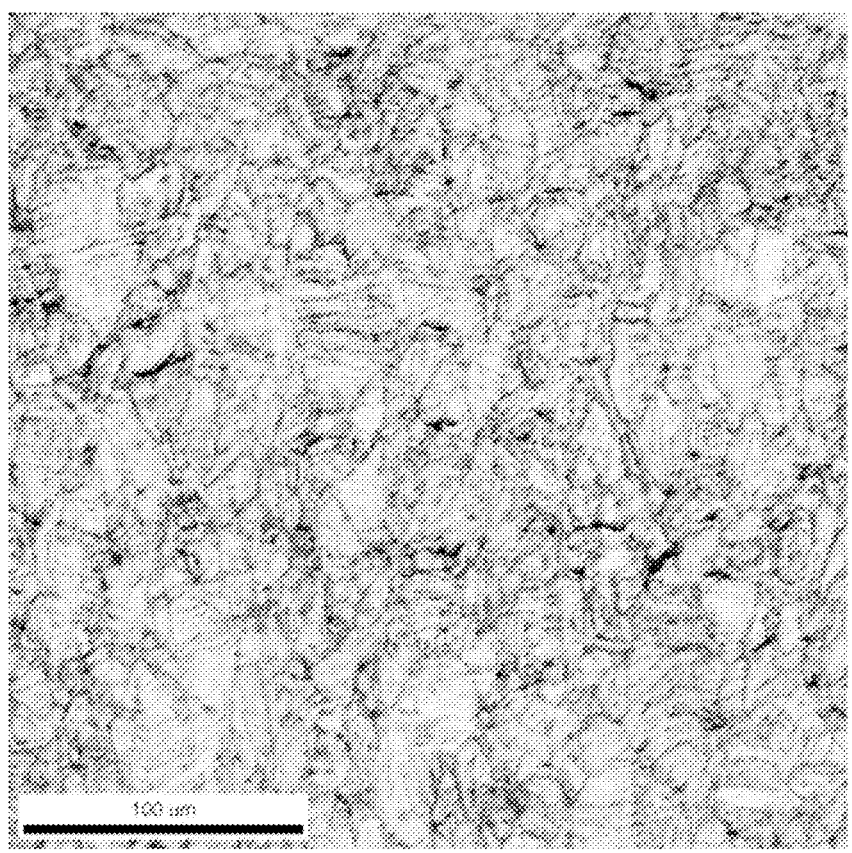

[FIG. 6]
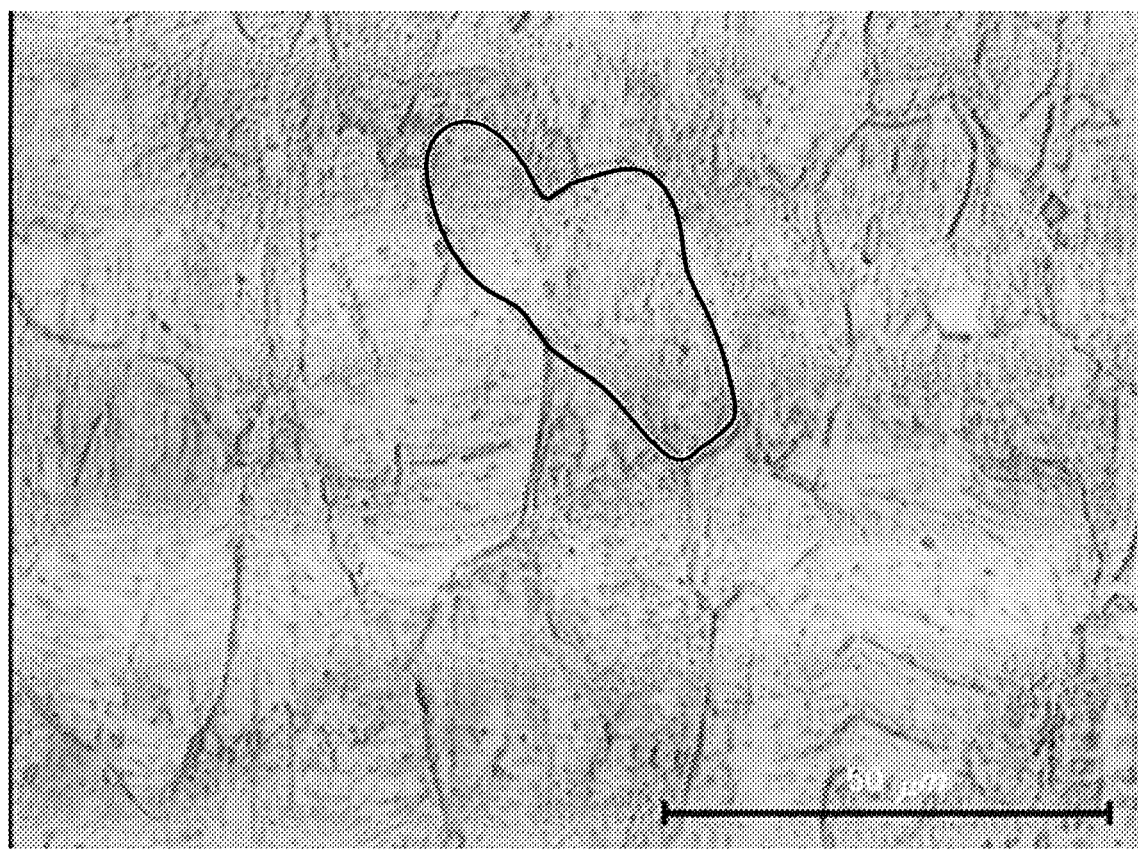

[FIG. 7]
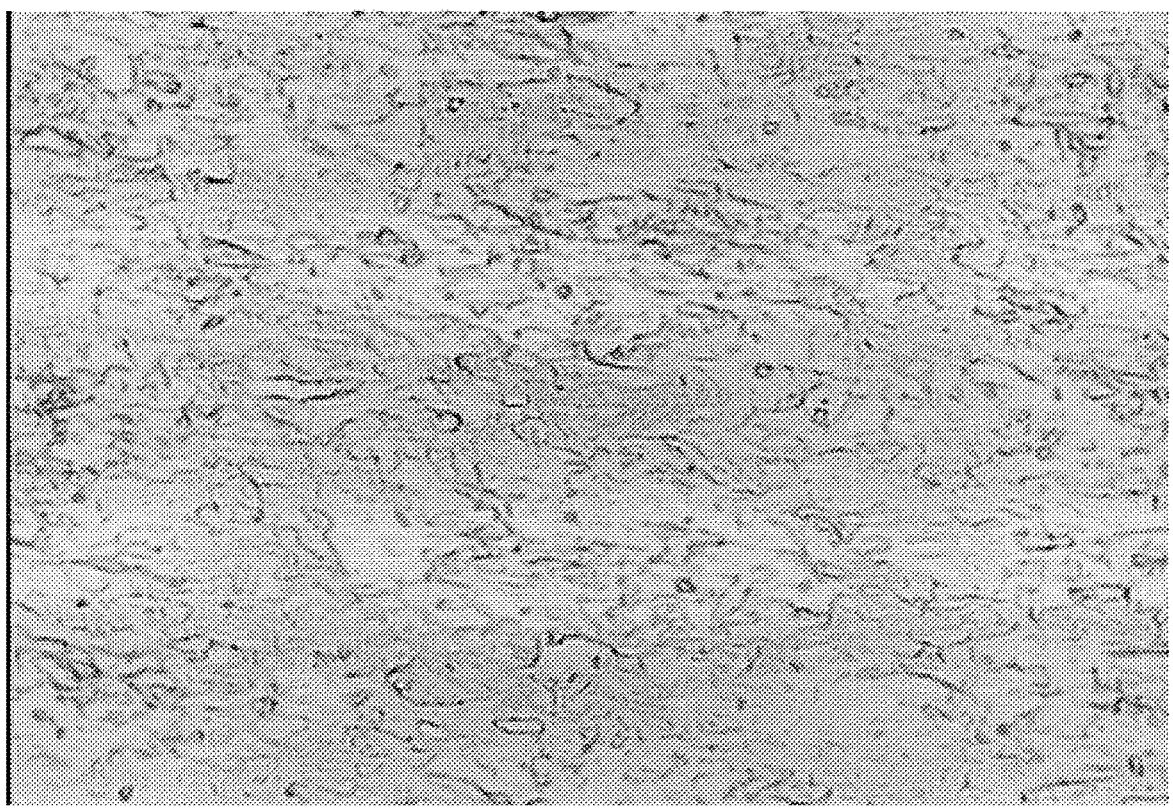

[FIG. 8]
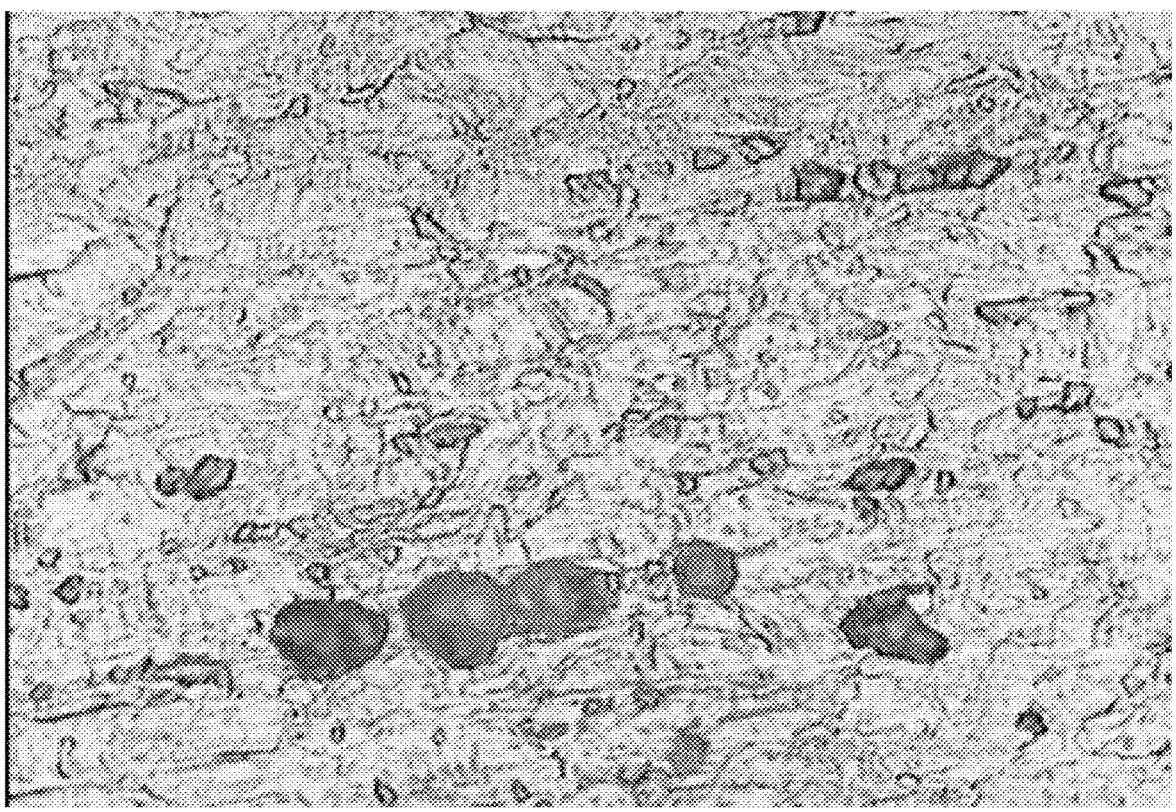

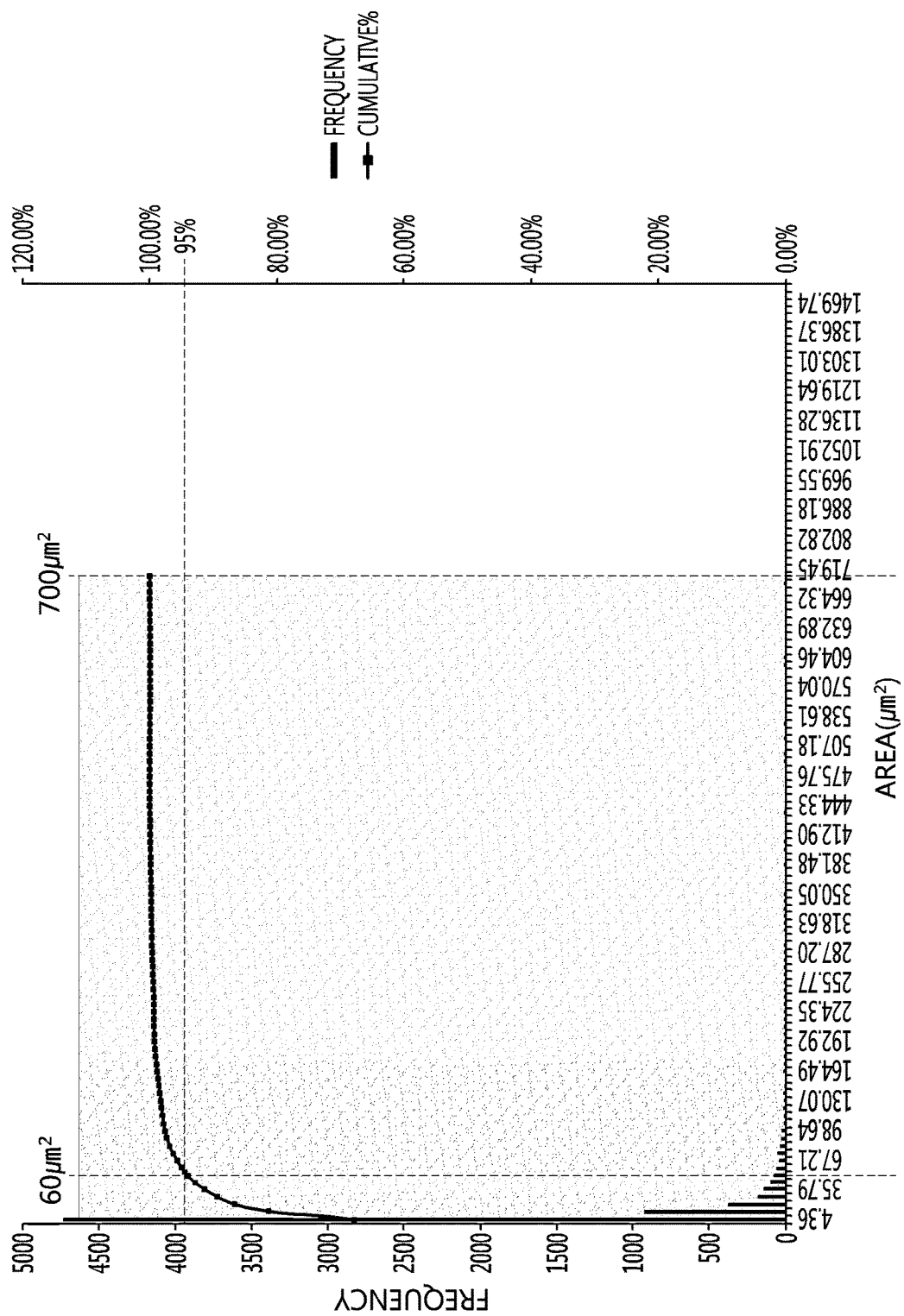
[FIG. 9]

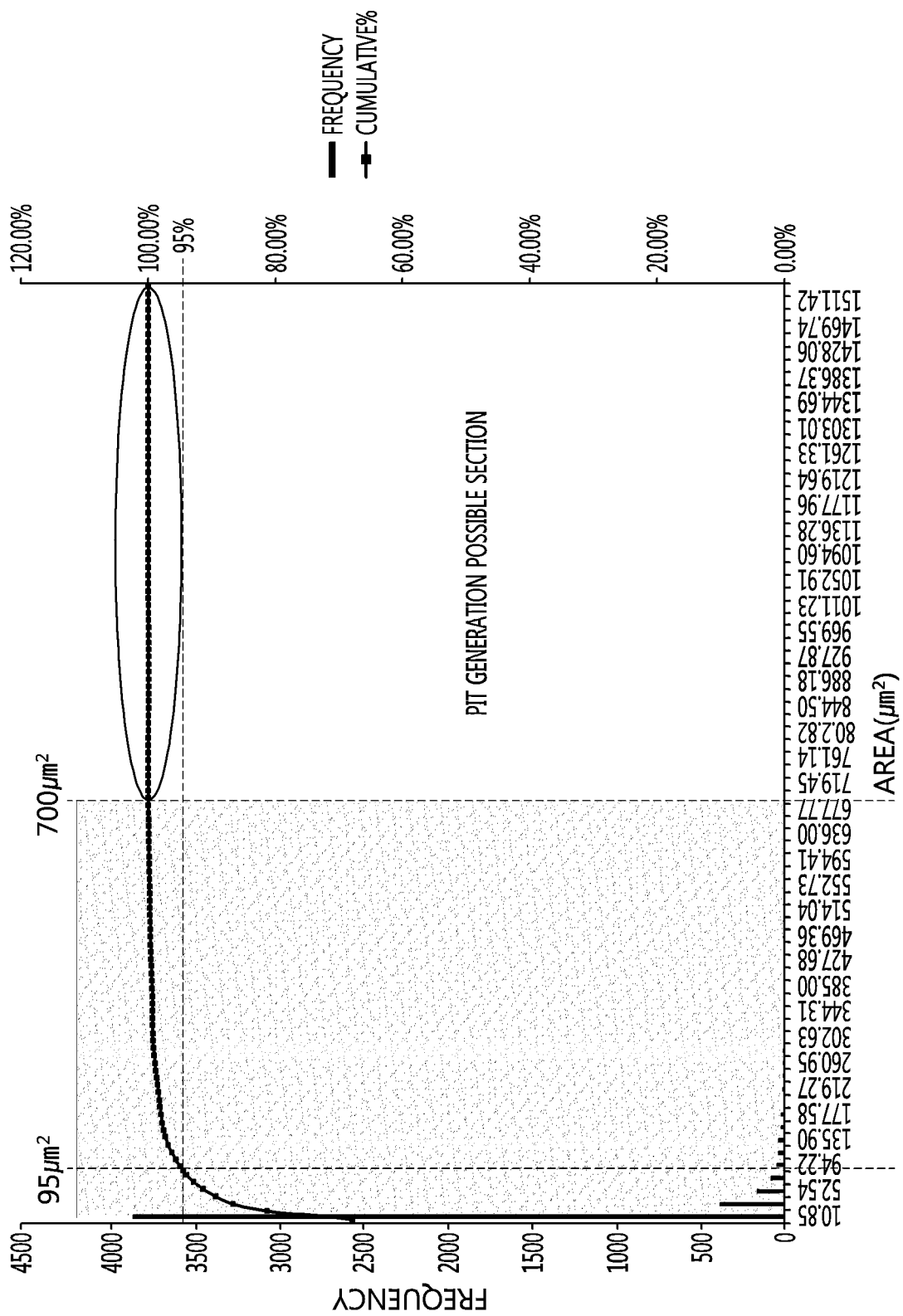

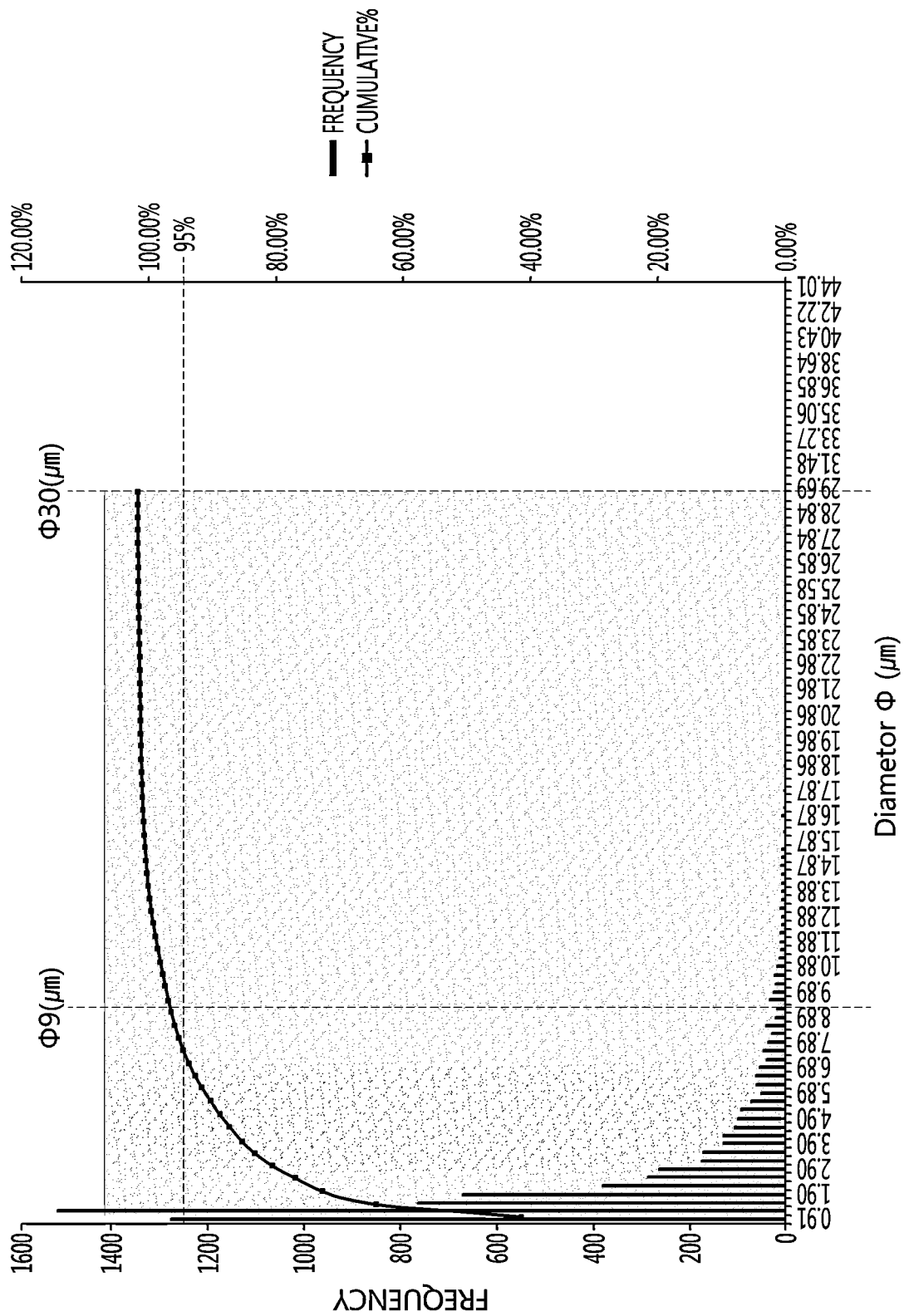
[FIG. 11]

[FIG. 12]
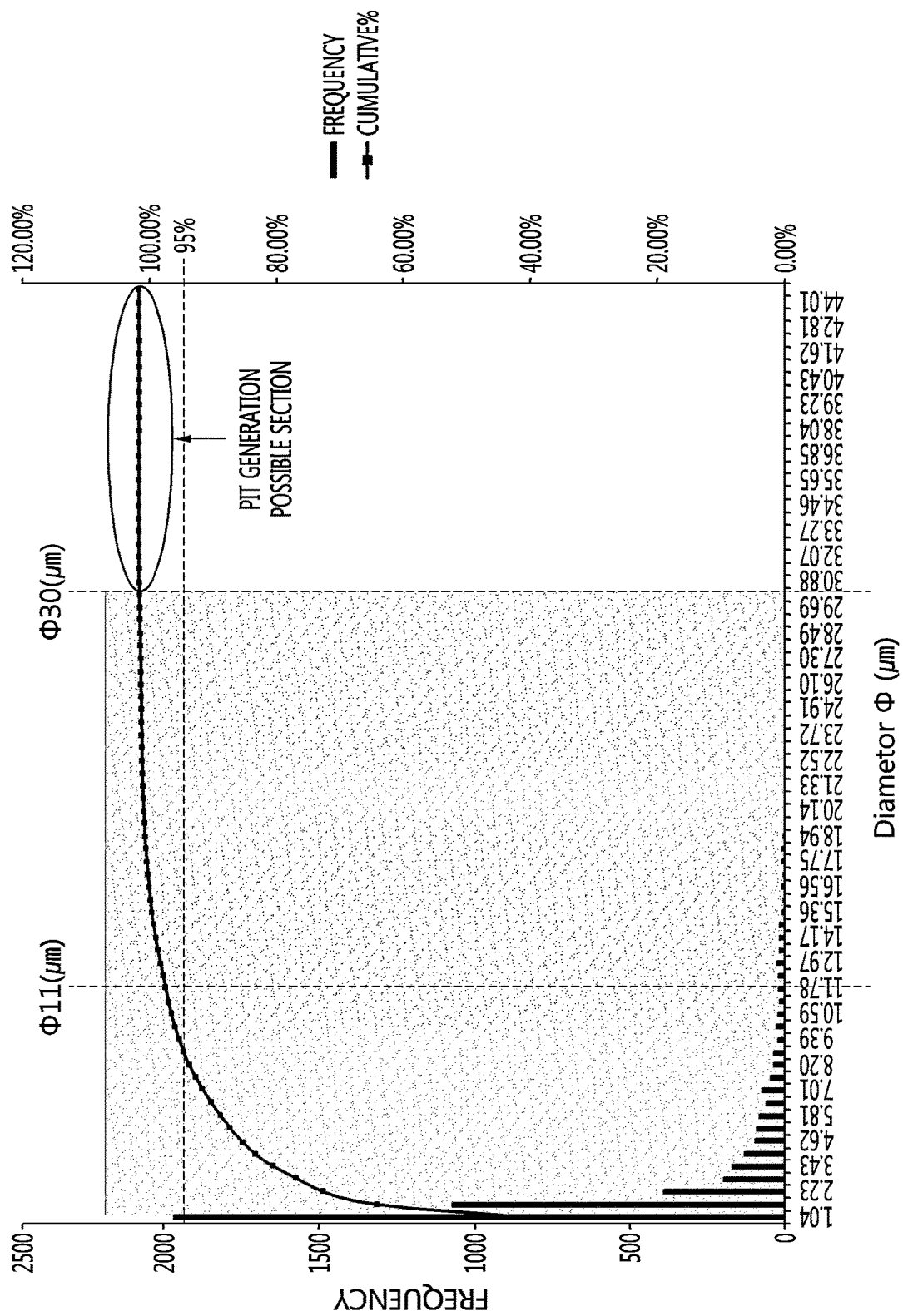

[FIG. 13]
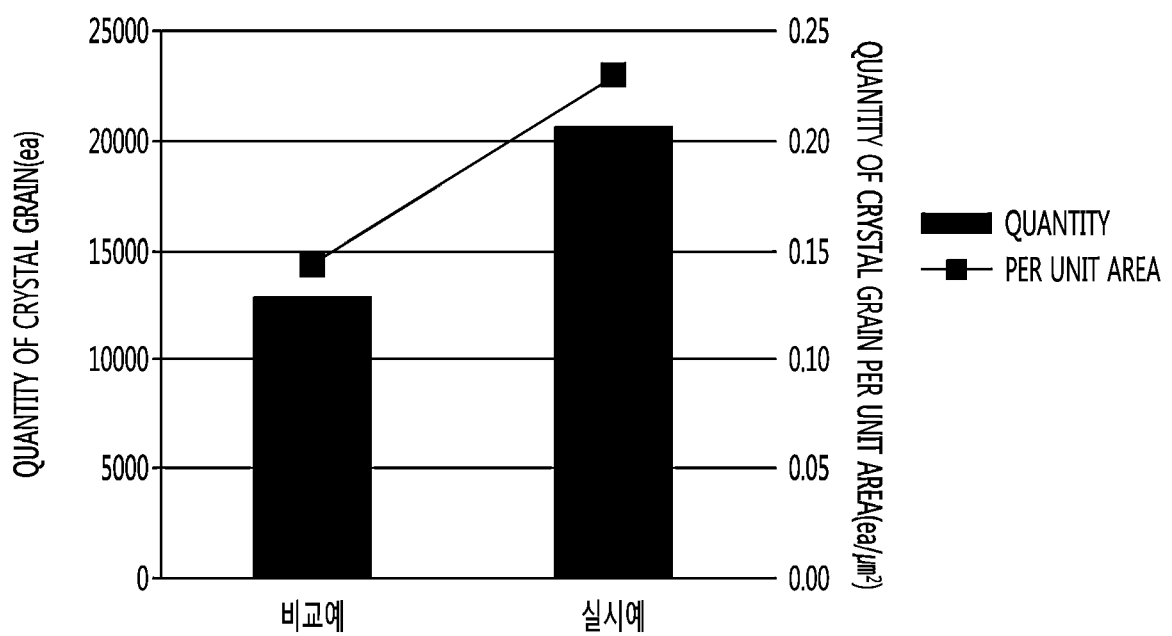

[FIG. 14]
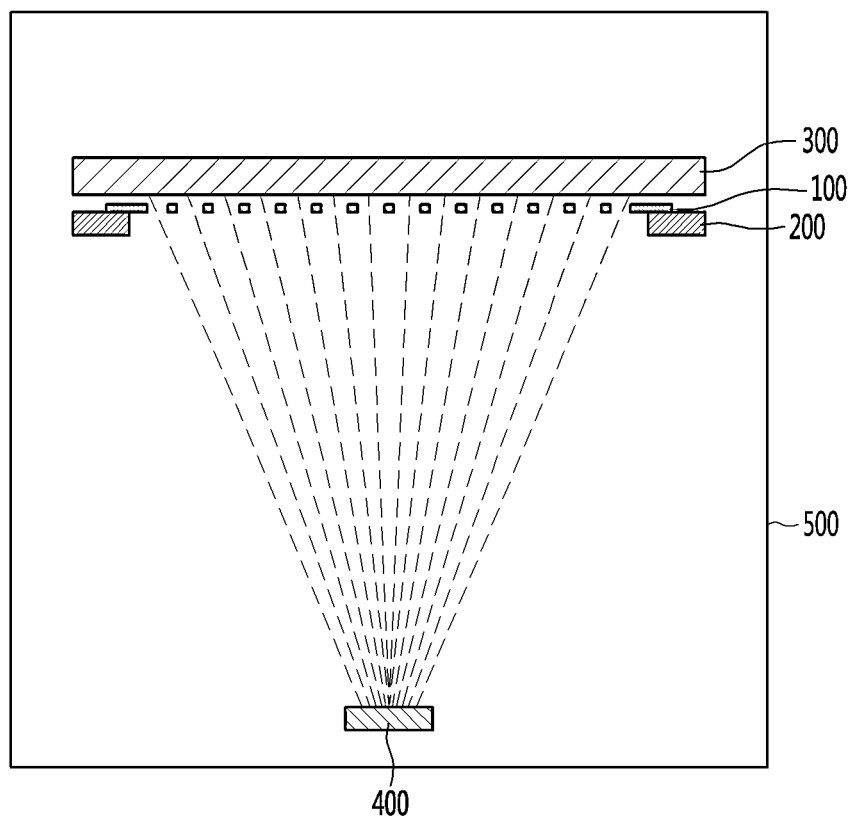
[FIG. 15]
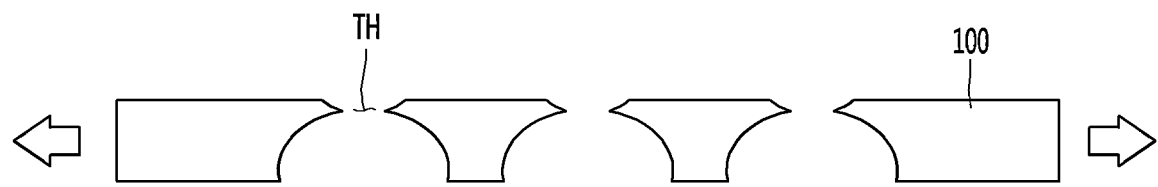

[FIG. 16]
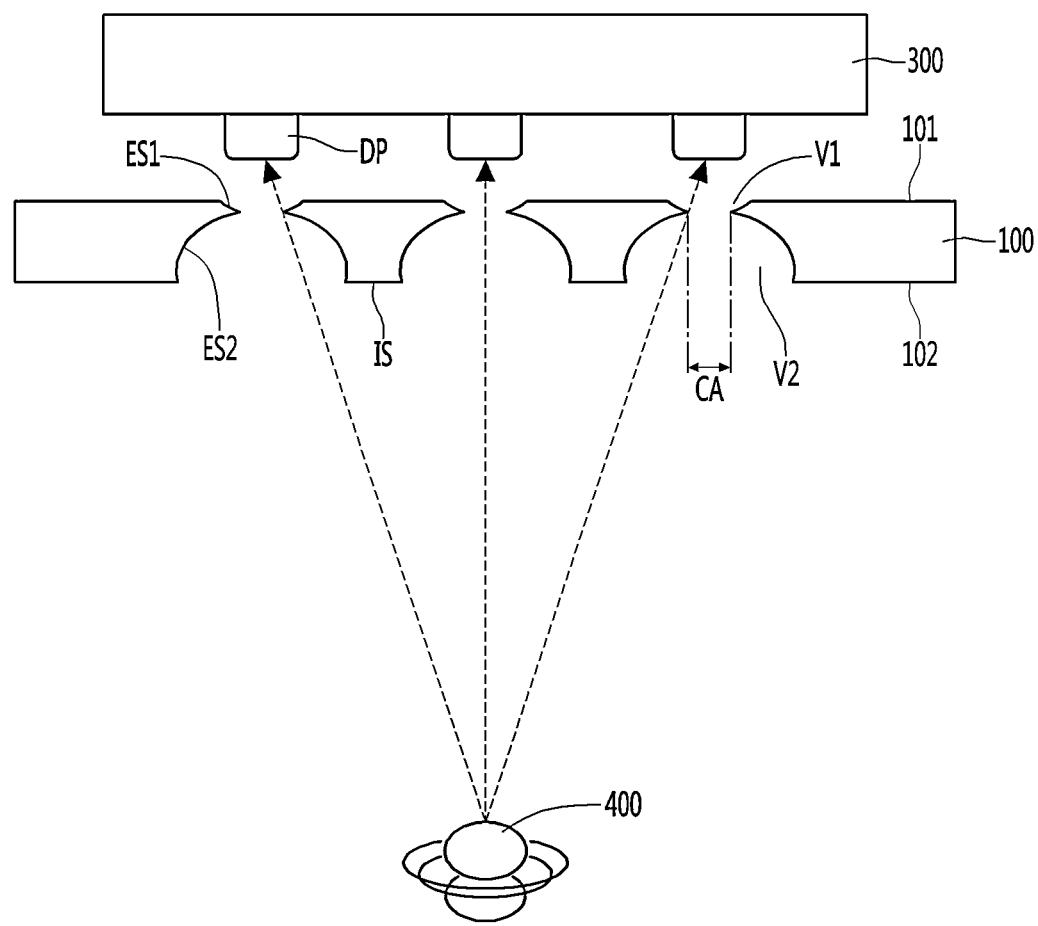

[FIG. 17]
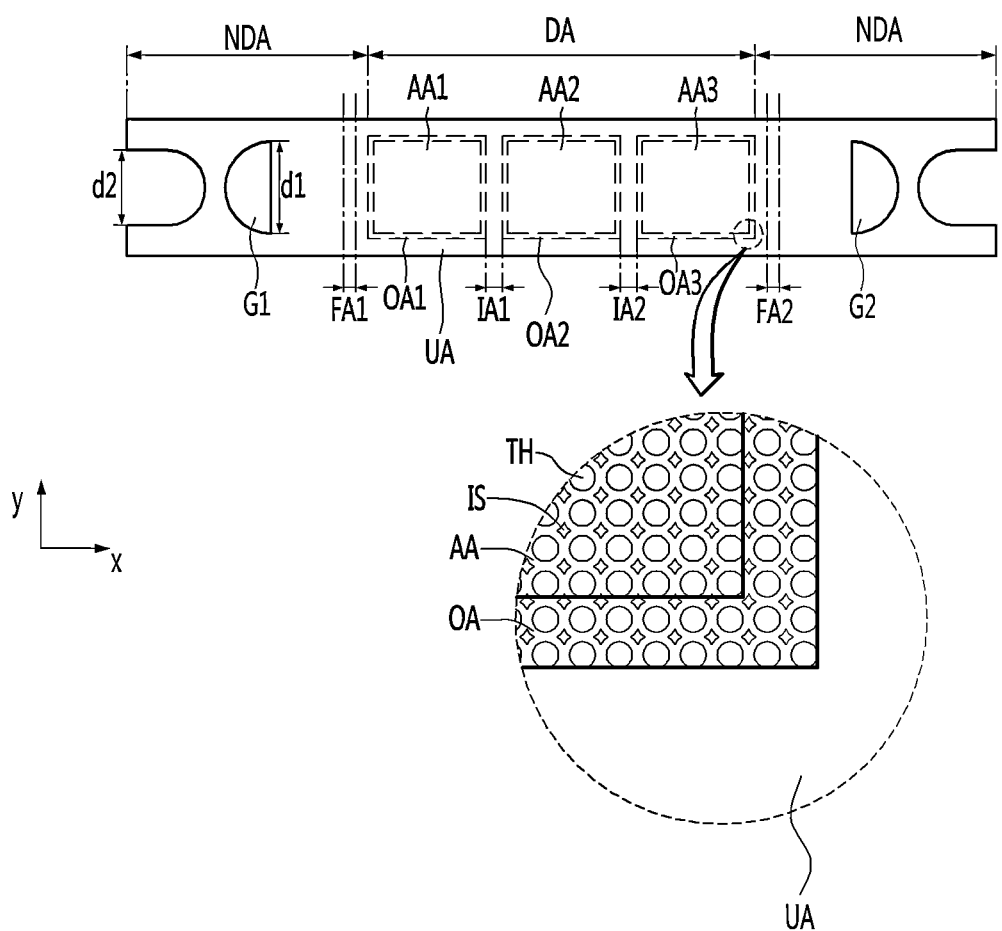

[FIG. 18]
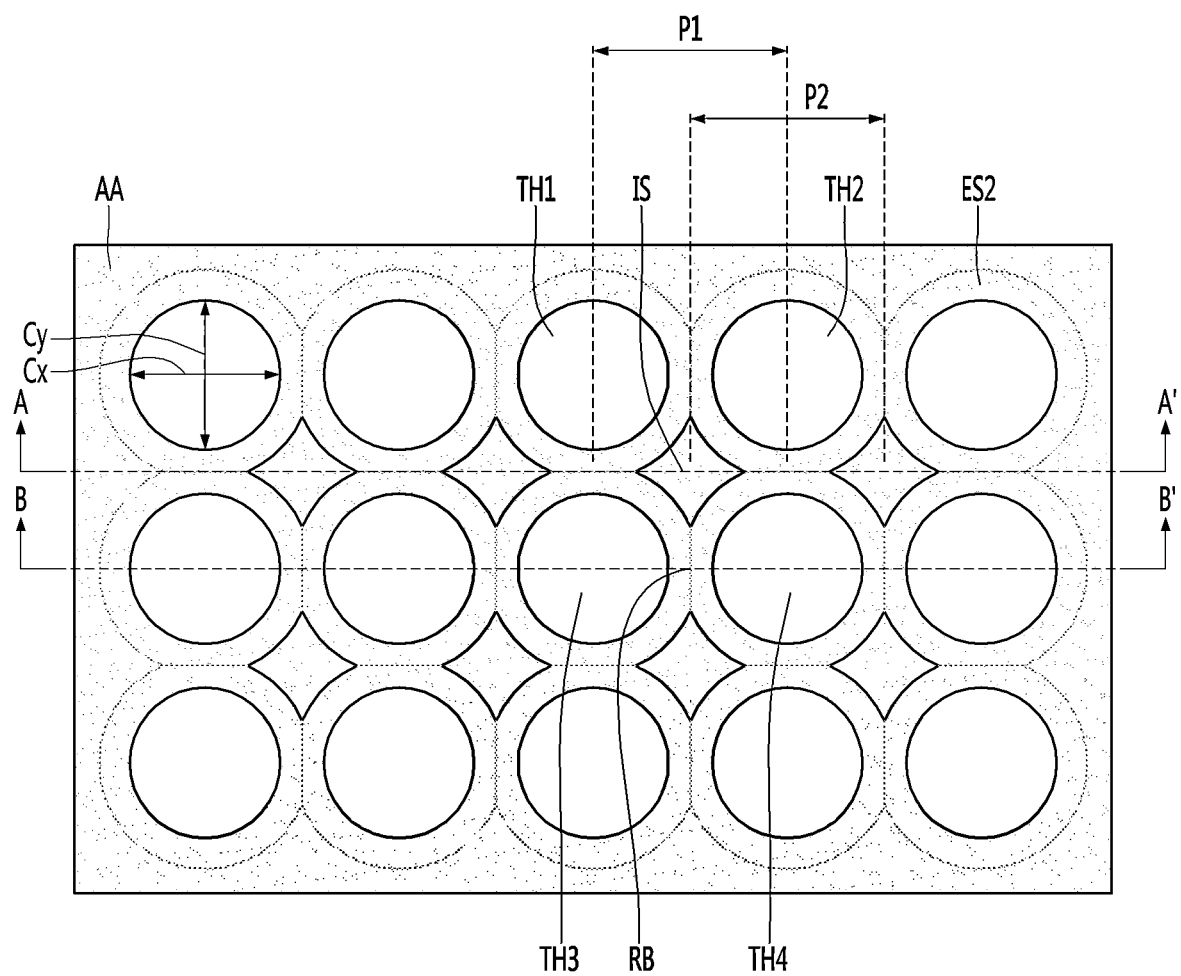

[FIG. 19]
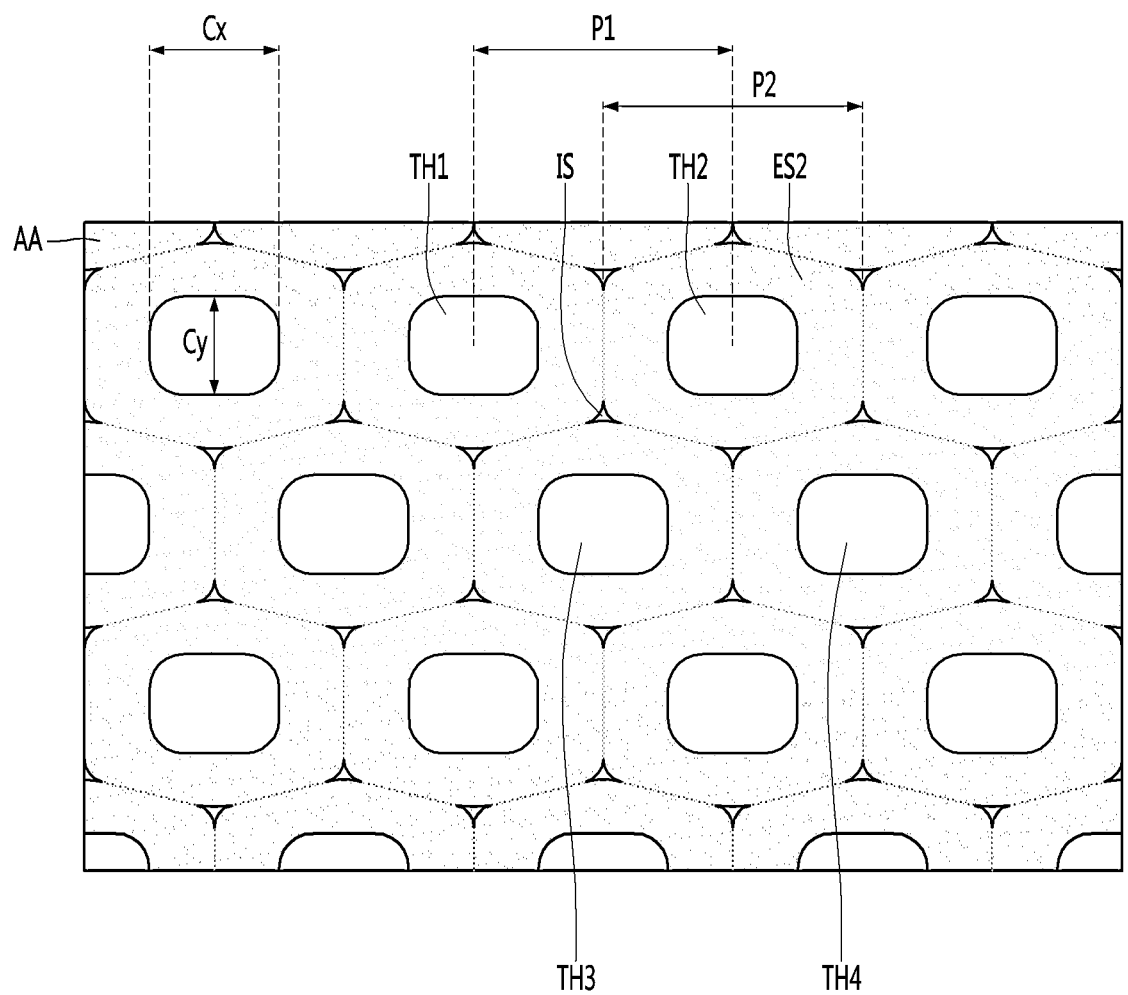
[FIG. 20]
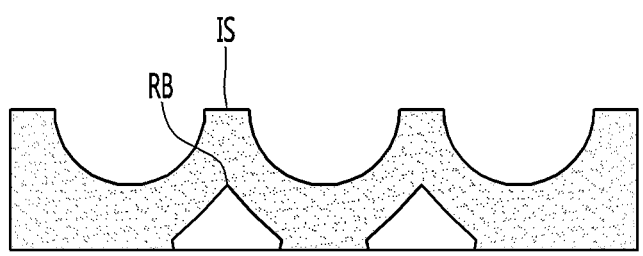

[FIG. 21]
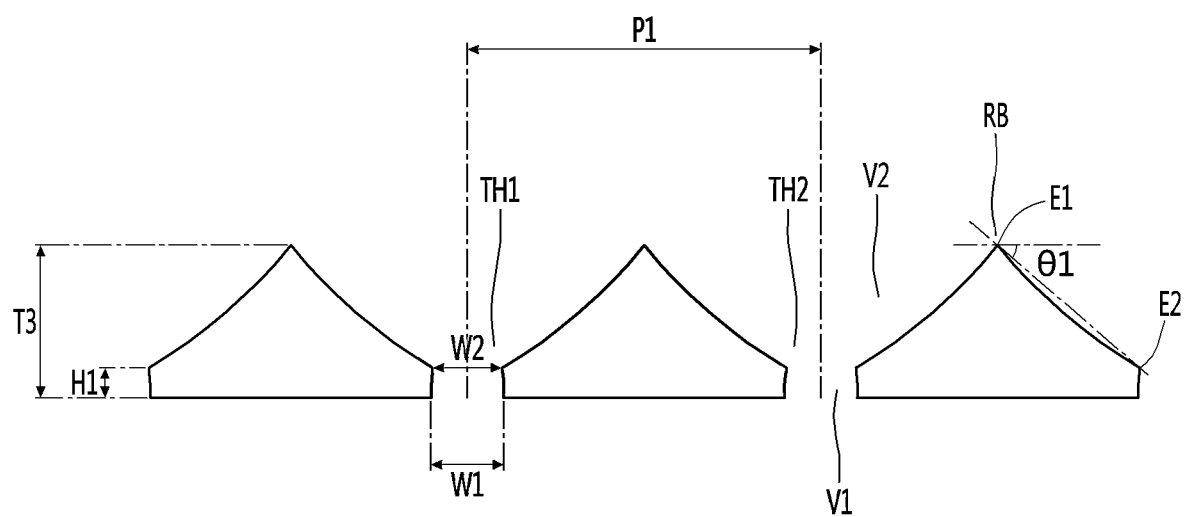

[FIG. 22]
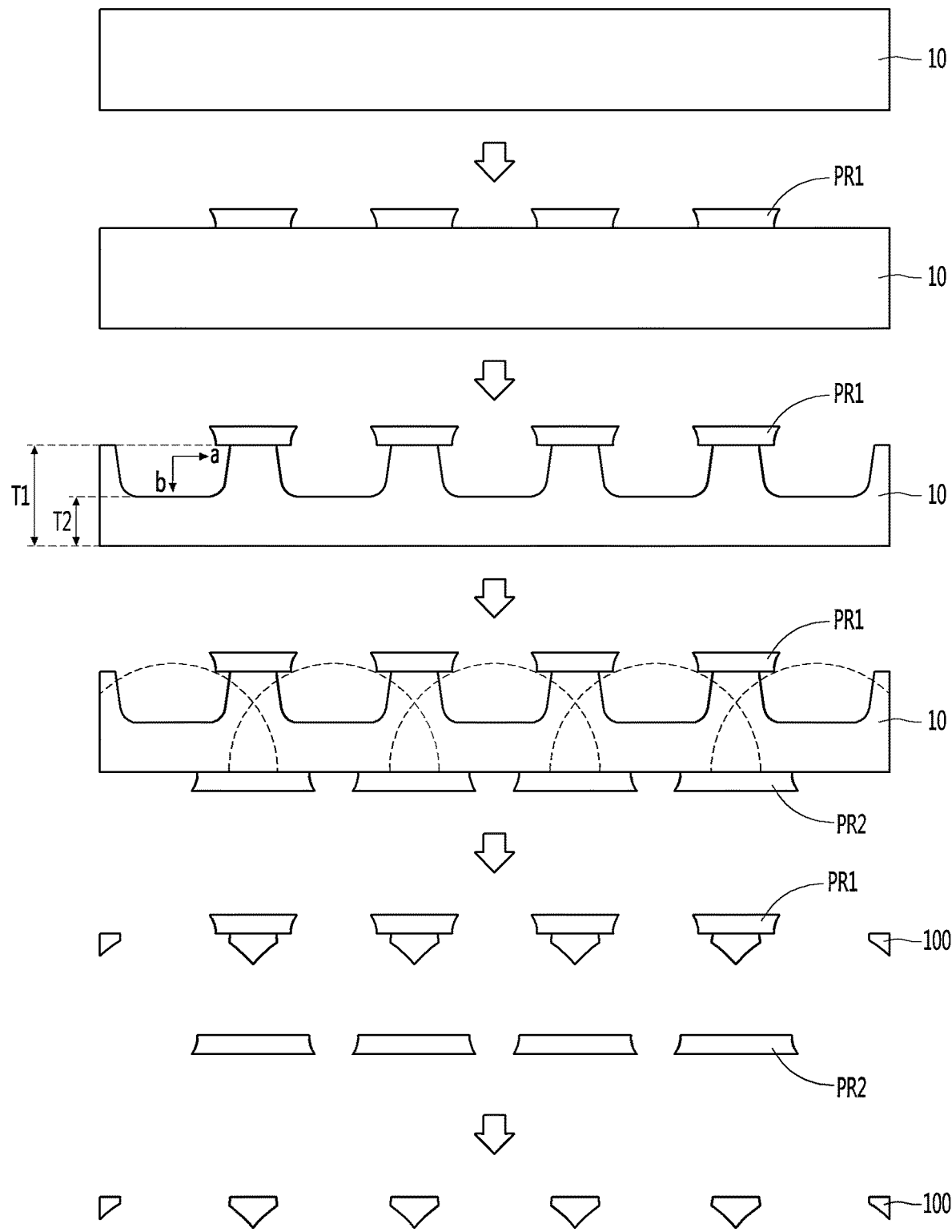

[FIG. 23]
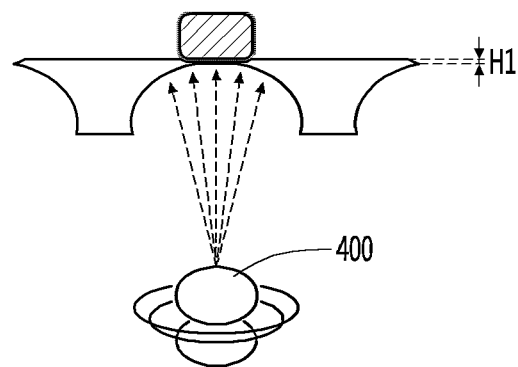
[FIG. 24]
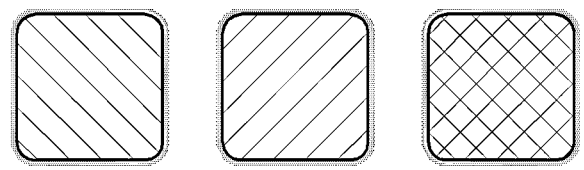

ALLOY METAL PLATE AND DEPOSITION MASK INCLUDING ALLOY METAL PLATE

CROSS-REFERENCE TO RELATED PATENT APPLICATIONS

This application is a U.S. National Stage Application under 35 U.S.C. § 371 of PCT Application No. PCT/KR2019/014939, filed Nov. 6, 2019, which claims priority to Korean Patent Application Nos. 10-2018-0142628, filed Nov. 19, 2018 and 10-2018-0143405, filed Nov. 20, 2018, whose entire disclosures are hereby incorporated by reference.

TECHNICAL FIELD

Embodiments relate to a metal plate of an iron (Fe)-nickel (Ni) alloy and a deposition mask for OLED pixel deposition manufactured by the alloy metal plate.

BACKGROUND

A display device is used by being applied to various devices. For example, the display device is used by being applied to not only small devices such as smart phones and tablet PCs but also large devices such as TVs, monitors, and public displays (PDs). In particular, recently, the demand for ultra-high definition (UHD) of 500 pixels per inch (PPI) or more has increased, and high resolution display devices have been applied to small devices and large devices. Accordingly, interest in technologies for realizing low power and high resolution is increasing.

Generally used display devices may be largely classified into a liquid crystal display (LCD), an organic light emitting diode (OLED), and the like according to a driving method.

The LCD is a display device driven by using a liquid crystal, and has a structure in which a light source including a cold cathode fluorescent lamp (CCFL), a light emitting diode (LED), or the like is disposed at lower portion of the liquid crystal. The LCD is a display device driven by controlling an amount of light emitted from the light source using the liquid crystal disposed on the light source.

In addition, the OLED is a display device that is driven by using an organic material, and does not require a separate light source, and the organic material itself may function as a light source and may be driven with low power consumption. In addition, OLED has attracted attention as a display device that may express an infinite contrast ratio, has a response speed of about 1000 times faster than the LCD, and may replace the LCD with an excellent viewing angle.

In particular, the organic material included in an emission layer of the OLED may be deposited on a substrate by a deposition mask called a fine metal mask (FMM), and the deposited organic material may be formed in a pattern corresponding to the pattern formed on the deposition mask to serve as a pixel. Specifically, the deposition mask includes through-holes formed at a position corresponding to a pixel pattern, and organic materials such as red, green, blue may be deposited on the substrate through the through-holes. Accordingly, the pixel pattern may be formed on the substrate.

The deposition mask may be manufactured from a metal plate made of an iron (Fe) and nickel (Ni) alloy. For example, the deposition mask may be made of an iron-nickel alloy called invar. As described above, the deposition mask may include a through-hole for organic material deposition, and the through-hole may be formed by an etching process.

Meanwhile, a surface of the metal plate is etched using an acid-based etchant before forming the through-hole on the surface of the metal plate, and thus a surface treatment process is performed to remove impurities such as foreign matter and rust remaining on the surface of the metal plate.

The impurities may be removed by etching the surface of the metal plate by such a surface treatment process.

At this time, when the surface of the metal plate is not uniformly etched, a dent phenomenon may occur in which a plurality of pits are generated on the surface of the metal plate. Such a dent phenomenon may cause defects when the through-hole is formed as a depth of a pit increases.

Accordingly, there is a problem that characteristics such as a diameter, shape and depth of the through-hole formed on the surface of the metal plate are not uniform, and thus there is a problem that an amount of organic matter passing through the through-hole is reduced and deposition efficiency is lowered. In addition, there is a problem that since the organic matter deposited on the substrate is not made uniform, and thus deposition failures may occur.

Therefore, a new alloy metal plate that may solve the above problems and a deposition mask including the metal plate are required.

SUMMARY

Technical Problem

An embodiment is directed to providing an iron-nickel alloy metal plate that may reduce a surface pit of a metal plate and improve the efficiency of a deposition mask manufactured through the metal plate by controlling a depth thereof, and a deposition mask for OLED pixel deposition manufactured through the same.

Technical Solution

In an alloy metal plate according to an embodiment, diffraction intensity of a (111) plane of the alloy metal plate is defined as I (111), diffraction intensity of a (200) plane of the alloy metal plate is defined as I (200), diffraction intensity of a (220) plane of the alloy metal plate is defined as I (220), a diffraction intensity ratio of the I (200) is defined by the following Equation 1, and a diffraction intensity ratio of the I (220) is defined by the following Equation 2. At this time, the A is 0.5 to 0.6, the B is 0.3 to 0.5, and the value A may be larger than a value B.

$$A = I(200)/\{I(200)+I(220)+I(111)\} \qquad \text{[Equation 1]}$$

The diffraction intensity ratio of the I (220) is defined by the following Equation 2.

$$B = I(220)/\{I(200)+I(220)+I(111)\} \qquad \text{[Equation 2]}$$

In addition, in an iron (Fe)-nickel (Ni) alloy metal plate of a deposition mask for OLED pixel deposition according to an embodiment, the metal plate is formed of a plurality of crystal grains, and the maximum area of the crystal grains measured over the entire area of the metal plate is 700 μm² or less.

In the iron (Fe)-nickel (Ni) alloy metal plate of a deposition mask for OLED pixel deposition according to the embodiment, when measuring from small crystal grains in all crystal grains measured over the entire area of the metal plate, the maximum area of 95% of the crystal grains is 60 μm² or less.

In the iron (Fe)-nickel (Ni) alloy metal plate of a deposition mask for OLED pixel deposition according to the embodiment, the maximum particle diameter of the crystal grains measured in the entire area of the metal plate is 30 μm or less.

In the iron (Fe)-nickel (Ni) alloy metal plate of a deposition mask for OLED pixel deposition according to the embodiment, when measuring from small crystal grains in the entire crystal grains measured over the entire area of the metal plate, the maximum particle diameter of 95% of the crystal grains is 9 μm or less.

In the iron (Fe)-nickel (Ni) alloy metal plate of a deposition mask for OLED pixel deposition according to the embodiment, a quantity per unit area of the plurality of crystal grains is 0.20 ea/μm$^2$ to 0.25 ea/μm$^2$.

Advantageous Effects

A metal plate according to an embodiment may minimize a difference in an etch rate according to an etching direction by controlling each ratio of crystal planes included in the metal plate.

Accordingly, when etching the metal plate, the etch rate differs between a crystal plane with a high atomic density and a crystal plane with a low atomic density, and thus it is possible to minimize surface defects caused by uneven etching, that is, occurrence of pits and deepening of the pits.

In addition, a nickel-iron alloy metal plate according to an embodiment may reduce a number of pits generated after surface treatment by controlling an area, a particle diameter, and a size of crystal grains.

Specifically, the maximum area of the crystal grains may be controlled to 700 μm2 or less, and the particle diameter of the crystal grains may be controlled to 30 μm or less. Further, the size of the crystal grains may be minimized and a quantity of crystal grains per unit area may be increased.

That is, a crystal grain density of a surface formed by the crystal grains is increased by controlling the maximum area and particle diameter of the crystal grains to a predetermined size or less, and accordingly, it is possible to minimize formation of surface grooves, i.e. pits generated during an etching process of surface treatment.

Therefore, when manufacturing a deposition mark using the metal plate, it is possible to make uniform characteristics such as a diameter, a shape and a depth of through-holes formed in the metal plate, thereby improving deposition efficiency of the deposition mark and preventing deposition failures.

BRIEF DESCRIPTION OF THE DRAWINGS

FIG. 1 is a cross-sectional view of a metal plate according to a first embodiment.

FIG. 2 is a graph illustrating diffraction intensity of X-rays of the metal plate according to the first embodiment.

FIGS. 3 and 4 are views illustrating scanning electron microscope (SEM) photographs of a surface of a metal plate according to a second embodiment.

FIGS. 5 and 6 are views illustrating scanning electron microscope (SEM) photographs of a surface of a metal plate according to a comparative example.

FIG. 7 is a view illustrating a scanning electron microscope (SEM) photograph of a surface of a surface-treated metal plate according to the second embodiment.

FIG. 8 is a view illustrating a scanning electron microscope (SEM) photograph of a surface of a surface-treated metal plate according to the comparative example.

FIGS. 9 and 10 are views illustrating graphs corresponding to crystal grain areas of the metal plates according to the second embodiment and the comparative example.

FIGS. 11 and 12 are views illustrating graphs corresponding to crystal particle diameters of the metal plates according to the second embodiment and the comparative example.

FIG. 13 is a view illustrating a graph corresponding to a quantity of crystal grains of the metal plates according to the second embodiment and the comparative example.

FIGS. 14 to 16 are conceptual diagrams for describing a process of depositing an organic material on a substrate by using a deposition mask manufactured with a metal plate according to an embodiment.

FIG. 17 is view illustrating a plan view of a deposition mask according to an embodiment.

FIG. 18 is view illustrating a plan view of an effective portion of a deposition mask according to an embodiment.

FIG. 19 is view illustrating another plan view of a deposition mask according to an embodiment.

FIG. 20 is a view in which a cross-sectional view taken along line A-A' and a cross-sectional view taken along line B-B' are overlapped in FIG. 18.

FIG. 21 is a cross-sectional view taken along line B-B' in FIG. 18.

FIG. 22 is views illustrating a manufacturing process of a deposition mask according to an embodiment.

FIGS. 23 and 24 are views illustrating a deposition pattern formed by a deposition mask according to an embodiment.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an iron-nickel alloy metal plate according to an embodiment and a deposition mask for OLED pixel deposition using the same will be described with reference to drawings.

First, a deposition mask according to a first embodiment will be described with reference to FIGS. 1 and 2.

FIG. 1 is a cross-sectional view of an alloy metal plate according to the first embodiment.

The metal plate 10 may include a metal material. For example, the metal plate 10 may include a nickel (Ni) alloy. Specifically, the metal plate 10 may include an alloy of iron (Fe) and nickel (Ni).

For example, the metal plate 10 may include about 60 wt % to about 65 wt % of the iron, and the nickel may be included about 35 wt % to about 40 wt %. Specifically, the metal plate 10 may include about 63.5 wt % to about 64.5 wt % of the iron, and the nickel may be included about 35.5 wt % to about 36.5 wt %.

The weight % of the metal plate 10 may be confirmed using a method of examining the wt % of each component by selecting a specific region a*b on a plane of the metal plate 100, sampling a test piece (a*b*t) corresponding to the thickness t of the metal plate 100, and dissolving it in a strong acid, etc. However, the embodiment is not limited thereto, and the content may be confirmed by various methods.

In addition, the metal plate 10 may further include at least one element of a small amount of carbon (C), silicon (Si), sulfur (S), phosphorus (P), manganese (Mn), titanium (Ti), cobalt (Co), copper (Cu), Silver (Ag), vanadium (V), niobium (Nb), indium (In), and antimony (Sb). Here, the small amount may mean not more than 1 w %. That is, the metal plate 10 may include an invar.

The invar is an alloy including iron and nickel and is a low thermal expansion alloy having a thermal expansion coefficient close to zero. Since the invar has a very small thermal expansion coefficient, it is used for precision parts such as masks and precision equipment. Therefore, a deposition mask manufactured using the metal plate 10 may have improved reliability, thereby preventing deformation and increasing lifetime.

The metal plate 10 including the alloy of iron and nickel may be manufactured by a cold rolling method. Specifically, the metal plate 10 may be formed by melting, forging, hot rolling, normalizing, primary cold rolling, primary annealing, secondary cold rolling, and secondary annealing processes, and may have a thickness of 30 μm or less. Alternately, the metal plate 10 may have a thickness of 30 μm or less through an additional thickness reduction process other than the above processes.

Meanwhile, the metal plate 10 may have a rectangular shape. Specifically, the metal plate 10 may have a rectangular shape with a major axis and a minor axis, and may have a thickness of about 30 μm or less.

As described above, the metal plate 10 may include an alloy including iron and nickel, and in case of the alloy including iron and nickel, the metal plate 10 may be formed in a crystal structure of a face centered cubic (FCC) structure.

In case of the FCC structure, each surface may have different atomic densities. That is, the metal plate 10 may have different atomic densities for each crystal plane. Specifically, any one crystal plane may have an atomic density larger or smaller than that of the other crystal plane.

Accordingly, when the metal plate 10 is etched, an etch rate may be different depending on a direction of each crystal plane. Due to a difference in etch rate depending on a crystal plane direction, when the metal plate is surface-treated, the surface of the metal plate may be etched unevenly. Accordingly, after the surface treatment of the metal plate, a plurality of grooves, that is, pits P may be generated on a surface S of the metal plate as shown in FIG. 1.

In order to solve the above problems, the metal plate according to the embodiment may reduce pits, etc. due to uneven etching by controlling a ratio of a plurality of crystal planes of the metal plate.

FIG. 2 is a graph obtained by measuring X-ray diffraction intensity of a metal plate according to a first embodiment. Specifically, diffraction intensities on (111), (200), and (220) planes of an iron-nickel alloy metal plate were measured respectively by using CuK α X-Ray.

Referring to FIG. 2, it may be seen that peak values of the (111) plane, (200) plane, and (220) plane of the metal plate according to the first embodiment are all different.

Specifically, it may be seen that a peak value of a metal plate 10 according to the first embodiment is the largest in the (200) plane, the second largest in the (220) plane, and the smallest in the (111) plane.

That is, it may be seen that, in the metal plate 10 according to the first embodiment, the (200) plane is larger than the (220) plane and the (111) plane, and the (220) plane is larger than the (111) plane.

Specifically, diffraction intensity of the (220) plane of the metal plate 10 may be defined as I (220), diffraction intensity of the (200) plane of the metal plate may be defined as I (200), and diffraction intensity of the (111) plane of the metal plate may be defined as I (111).

At this time, a diffraction intensity ratio of the I (200) may be defined by the following Equation 1.

$$A = I(200)/\{I(200)+I(220)+I(111)\} \qquad \text{[Equation 1]}$$

In addition, a diffraction intensity ratio of the I (220) is defined by the following Equation 2.

$$B = I(220)/\{I(200)+I(220)+I(111)\} \qquad \text{[Equation 2]}$$

At this time, the value A may be equal to or greater than the value B. Specifically, the value A may be larger than a value of the B.

Specifically, the A may be 0.6 or less, and the B may be 0.5 or less. More specifically, the A may be 0.5 to 0.6, and the B may be 0.3 to 0.5.

In addition, a ratio of the A to the B (A/B) may be 1 to 2. That is, the value A may be greater than the value B and less than twice the value B.

Further, a direction of the (111) plane, the (200) plane, and the (220) plane may correspond to an etching direction of the metal plate.

The diffraction intensity ratio of I (220), I (200), and I (111), which are the crystal planes of the metal plate, may be related to a number and depth of pits formed on a surface of the metal plate.

Specifically, when the diffraction intensity ratio of I (220), I (200) and I (111), which are the crystal planes of the metal plate, is satisfied, the number and depth of pits formed on the surface of the metal plate may be reduced.

Specifically, the iron-nickel alloy metal plate may have crystal planes in various directions, and a ratio of the (220) crystal plane, (200) crystal plane and (111) crystal plane may be the largest.

In this case, sizes of the (220) crystal plane, (200) crystal plane, and (111) crystal plane of the metal plate may be different from each other, and accordingly, atomic densities of atoms of each crystal plane may be different from each other.

Accordingly, when the metal plate is etched, an etch rate differs between a crystal plane with a high atomic density and a crystal plane with a low atomic density, and thus pits due to uneven etching may be generated.

Therefore, it is most ideal that the crystal planes of the metal plate all have the same crystal orientation, but it is impossible in the process, so it is important to control the ratio of each crystal plane.

That is, the metal plate according to the first embodiment may minimize the difference in etch rate according to the etching direction by ideally controlling the ratio of each crystal plane, and thus it is possible to minimize surface defects caused by uneven etching, that is, occurrence of pits and deepening of the pits.

Accordingly, when manufacturing a deposition mark using the metal plate, it is possible to make uniform characteristics such as a diameter, a shape and a depth of through-holes formed in the metal plate, thereby improving deposition efficiency of the deposition mark and preventing deposition failures.

Hereinafter, the present disclosure will be described in more detail through metal plates according to embodiments and comparative examples. Such manufacturing examples are merely illustrative to describe the present disclosure in more detail. Therefore, the present disclosure is not limited to such manufacturing examples.

Manufacturing and Surface Measurement of Alloy Metal Plate

An alloy metal plate made of an iron-nickel alloy was prepared.

Subsequently, after controlling a diffraction intensity ratio of (220) crystal plane, (200) crystal plane, and (111) crystal plane of the alloy metal plate as shown in Table 1 below, in each example a pit depth and whether there was a defect after forming through-holes were measured.

Meanwhile, control of the ratio of the (220) crystal plane, the (200) crystal plane, and the (111) crystal plane of the alloy metal plate may be controlled in a cold rolling process of a manufacturing process of the alloy metal plate.

Subsequently, the diffraction intensity of the (111) plane of the alloy metal plate is defined as I (111), the diffraction intensity of the (200) plane of the alloy metal plate is defined as I (200), and the diffraction intensity of the (111) plane of the alloy metal plate is defined as I (111), and a diffraction intensity ratio of the I (200) is defined by the following Equation 1, a diffraction intensity ratio of the I (220) is defined by the following Equation 2, and the diffraction intensity ratios of the I (200) and the I (220) were measured.

Subsequently, a surface of the alloy metal plate was subjected to a surface treatment using an acid-based etchant.

Subsequently, a depth of a pit formed on the surface of the alloy metal plate was measured, and it was observed whether or not etching was defective after forming the through-holes.

Whether or not the etching is defective was determined as defective when a size is more than or equal to 10% of a size of a normal through-hole.

$$A = I(200)/\{I(200)+I(220)+I(111)\} \quad \text{[Equation 1]}$$

$$B = I(220)/\{I(200)+I(220)+I(111)\} \quad \text{[Equation 2]}$$

TABLE 1

|  | A | B | A/B |
|---|---|---|---|
| Exemplary Embodiment 1 | 0.55 | 0.40 | 1.375 |
| Exemplary Embodiment 2 | 0.53 | 0.42 | 1.262 |
| Exemplary Embodiment 3 | 0.54 | 0.42 | 1.29 |
| Exemplary Embodiment 4 | 0.53 | 0.40 | 1.33 |
| Exemplary Embodiment 5 | 0.51 | 0.42 | 1.21 |
| Exemplary Embodiment 6 | 0.50 | 0.44 | 1.14 |
| Exemplary Embodiment 7 | 0.50 | 0.41 | 1.22 |
| Comparative Example 1 | 0.41 | 0.50 | 0.82 |
| Comparative Example 2 | 0.42 | 0.24 | 1.75 |
| Comparative Example 3 | 0.38 | 0.31 | 1.23 |
| Comparative Example 4 | 0.47 | 0.24 | 1.96 |
| Comparative Example 5 | 0.29 | 0.42 | 0.69 |
| Comparative Example 6 | 0.22 | 0.51 | 0.43 |

TABLE 2

|  | Pit depth (μm) | Through-hole quality |
|---|---|---|
| Exemplary Embodiment 1 | 1.4 | Normal |
| Exemplary Embodiment 2 | 1.2 | Normal |
| Exemplary Embodiment 3 | 0.8 | Normal |
| Exemplary Embodiment 4 | 1.0 | Normal |
| Exemplary Embodiment 5 | 1.9 | Normal |
| Exemplary Embodiment 6 | 1.8 | Normal |
| Exemplary Embodiment 7 | 0.4 | Normal |
| Comparative Example 1 | 2.8 | Failure |
| Comparative Example 2 | 2.9 | Failure |
| Comparative Example 3 | 4.3 | Failure |
| Comparative Example 4 | 5.2 | Failure |
| Comparative Example 5 | 5.1 | Failure |
| Comparative Example 6 | 6.1 | Failure |

Referring to Tables 1 and 2, in alloy metal plates according to the Exemplary Embodiments, it may be seen that the A satisfies a range of 0.5 to 0.6, the B satisfies a range of 0.3 to 0.5, and the A/B satisfies a range of 1 to 2.

On the other hand, it may be seen that alloy metal plates according to the Comparative Examples do not satisfy at least one of the A, B and A/B.

In addition, in the alloy metal plates according to the Exemplary Embodiments, it may be seen that a depth of a pit formed after surface treatment is 2 μm or less. Accordingly, it may be seen that influence by the pit formed in the surface of the metal plate when forming a through-hole in the metal plate is slight, and thus quality of the through-hole is improved.

On the other hand, in the alloy metal plates according to the Comparative Examples, it may be seen that the depth of the pit formed after the surface treatment exceeds 2 μm. When the depth of the pit exceeds 2 μm, the pit becomes larger than a height H1 of a small surface hole, or is formed in the same manner, and thus influence on the through-hole by the pit increases. Accordingly, it may be seen that the influence by the pit formed in the surface of the metal plate when forming a through-hole in the metal plate is increased, and thus the quality of the through-hole is lowered.

Hereinafter, a deposition mask according to a second embodiment will be described with reference to FIG. 1, FIG. 3 to FIG. 13. In the description of the deposition mask according to the second embodiment, the description which is the same as or similar to that of the deposition mask according to the first embodiment above is omitted, and the same configurations are assigned by the same reference numerals.

As described above, the metal plate 10 may include an alloy metal including a plurality of metals such as iron, nickel, and the like.

The metal plate 10 may be formed by contacting a plurality of crystal grains constituting a plurality of metals with each other.

The plurality of crystal grains may have different sizes. Specifically, the plurality of crystal grains may have different areas. The plurality of crystal grains may have different particle diameters. In addition, the plurality of crystal grains may be formed in different shapes. Further, since the plurality of crystal grains are formed in different shapes and sizes, a quantity of crystal grains per unit area may be different from each other.

The shapes or sizes of such crystal grains may be related to quality of the surface of the metal plate 10. When manufacturing a deposition mask using the metal plate 10, an etching process may be performed by an acid-based etchant to remove impurities on the surface of the metal plate 10 before forming the through-hole.

At this time, the crystal grains having different shapes or sizes are distributed at each surface of the metal plate 10, and thus a groove having a recessed surface may be formed on the surface of the metal plate 10 during the surface treatment process. Such grooves are referred to as forming pits, and the pits may be a factor that deteriorates etching quality in a subsequent through-hole forming process.

Specifically, there may be a first region in which the crystal grains are densely gathered for each surface of the metal plate 10 and a second region in which the crystal grains are gathered so as not to be dense compared to the first region.

At this time, in case of the second region, an etching rate may be increased during the surface treatment process as compared with the first region, and the second region may be more etched, and thus pits and the like may occur on the surface of the metal plate 10.

In order to solve the above problems, the metal plate according to the second embodiment is directed to reducing occurrence of pits due to uneven etching by controlling an area, particle diameter and size of crystal grains forming the metal plate.

Specifically, in the metal plate according to the second embodiment, the area, the particle diameter, and the quantity of crystal grains per unit area of the plurality of crystal grains forming the metal plate may be controlled.

Control of Crystal Grain Area of Metal Plate

First, with reference to FIG. 9 and FIG. 10, it will be described that a surface pit is reduced by controlling an area of a plurality of crystal grains forming a metal plate 10 according to an embodiment.

Meanwhile, FIGS. 3, 4 and 7 are views illustrating photographs before and after surface treatment of a metal plate according to a second embodiment, and FIGS. 5, 6 and 8 are views illustrating photographs before and after surface treatment of a metal plate according to a comparative example for comparison with a metal plate according to an embodiment.

In the metal plate 10 according to the second embodiment, the area of the plurality of crystal grains may be controlled to be a predetermined size. The area of the crystal grain may be controlled in a cold rolling process of manufacturing processes of an alloy metal plate.

At this time, the area of the crystal grain may be measured by using an electron backscattered diffraction (EBSD) apparatus. Each area of the crystal grains may be measured by measuring a size of a thick frame region in FIGS. 4 and 6 with the EBSD apparatus.

Referring to FIG. 9, the maximum area of the crystal grains of the metal plate 10 according to the second embodiment may be 700 μm2 or less, and the maximum area of 95% of the crystal grains in the entire metal plate may be 60 μm2 or less.

That is, the maximum area of the crystal grains measured over the entire area of the metal plate 10 may be 700 μm2 or less, and when measuring from crystal grains having a smaller area of the entire crystal grains in the entire area of the metal plate, the maximum area of 95% of the crystal grains may be 60 μm2 or less.

Specifically, the maximum area of the crystal grains measured over the entire area of the metal plate 10 may be 660 μm2 to 700 μm2. More specifically, the maximum area of the crystal grains measured over the entire area of the metal plate 10 may be 680 μm2 to 700 μm2.

On the other hand, referring to FIG. 10, the maximum area of the crystal grains of the metal plate 10 according to the comparative example may be 1500 μm2 or less, and the maximum area of 95% of the crystal grains of the entire crystal grains in the metal plate may be 95 μm2 or less.

That is, the maximum area of the crystal grains measured over the entire area of the metal plate 10 may be 1500 μm2 or less, and when measuring from crystal grains having a smaller area of the entire crystal grains in the entire area of the metal plate, the maximum area of 95% of the crystal grains may be 95 μm2 or less.

Specifically, the maximum, minimum, and average sizes of crystal grains according to the second embodiment and the comparative example are as shown in Table 3.

TABLE 3

| | Maximum value ($\mu m^2$) | Minimum value ($\mu m^2$) | Average value ($\mu m^2$) | Standard deviation ($\mu m^2$) | 95% Cumulative ($\mu m^2$) |
|---|---|---|---|---|---|
| Exemplary Embodiment | 676.10 | 0.43 | 12.5 | 36.9 | 59.36 |
| Comparative Example | 1501.00 | 0.43 | 18.4 | 71.5 | 94.22 |

Referring to FIGS. 3, 4 and 7, in case of the metal plate according to the second embodiment, it may be seen that a number of pits generated from the surface of the metal plate after the surface treatment is small and a size of pits is small.

On the other hand, referring to FIGS. 5, 6 and 8, in case of the metal plate according to the comparative example, it may be seen that a number of pits generated from the surface of the metal plate after the surface treatment is increased as compared with the embodiment, and a size of pits formed is larger than that of the embodiment.

That is, referring to FIGS. 9 and 10, it may be seen that in the metal plate according to the comparative example, the number of pits may be increased rapidly from a region in which an area of crystal grains exceeds 700 μm2, and the size of pits is increased.

That is, it may be seen that the region in which the area of crystal grains exceeds 700 μm 2 in FIG. 10 is a region in which a lot of pits are generated.

Control of Crystal Particle Diameter of Metal Plate

Subsequently, with reference to FIG. 11 and FIG. 12, it will be described that a surface pit is reduced by controlling particle diameters of a plurality of crystal grains forming a metal plate 10 according to a second embodiment.

Meanwhile, FIGS. 3, 4 and 7 are views illustrating photographs before and after surface treatment of a metal plate according to an embodiment, and FIGS. 5, 6 and 8 are views illustrating photographs before and after surface treatment of a metal plate according to a comparative example for comparison with the metal plate according to the embodiment.

In the metal plate 10 according to the second embodiment, the particle diameters of the plurality of crystal grains may be controlled to be a predetermined size. Diameters of the crystal grains may be controlled in a cold rolling process of manufacturing processes of an alloy metal plate.

At this time, the particle diameter of the crystal grain may be indirectly measured through the area of the crystal grain. Specifically, each area of the crystal grains may be measured by measuring a size of the thick frame region in FIGS. 4 and 6 using the EBSD apparatus.

In addition, the particle diameter of the crystal grain may be measured by the following Equation.

$$2*\sqrt{area/\pi}$$ [Equation]

Specifically, the maximum, minimum, and average sizes of crystal grains according to the second embodiment and the comparative example are as shown in Table 4.

TABLE 4

| | Maximum value (μm²) | Minimum value (μm²) | Average value (μm²) | Standard deviation (μm²) | 95% Cumulative (μm²) |
|---|---|---|---|---|---|
| Exemplary Embodiment | 29.34 | 0.74 | 2.7 | 3.0 | 8.89 |
| Comparative Example | 43.71 | 0.74 | 2.8 | 4.0 | 11.18 |

Referring to FIG. 11, the maximum particle diameter of the crystal grains of the metal plate 10 according to the second embodiment 30 μm or less, and the maximum particle diameter of 95% of the crystal grains of the entire crystal grains of the metal plate is 9 μm or less.

That is, the maximum particle diameter of the crystal grains measured over the entire area of the metal plate 10 may be 30 μm or less, and when measuring from crystal grains having a smaller particle diameter of the entire crystal grains in the entire area of the metal plate, the maximum particle diameter of 95% of the crystal grains may be 9 μm or less.

The maximum particle diameter of the crystal grains measured over the entire area of the metal plate 10 may be 25 μm to 30 μm. More specifically, the maximum particle diameter of the crystal grains measured over the entire area of the metal plate 10 may be 26 μm to 29 μm.

On the other hand, referring to FIG. 12, the maximum particle diameter of the crystal grain of the metal plate 10 according to the comparative example is 44 μm or less, and the maximum particle diameter of 95% of the crystal grains of the entire metal plate may be 11 μm or less.

That is, the maximum particle diameter of the crystal grains measured over the entire area of the metal plate 10 may be 44 μm or less, and when measuring from crystal grains having a smaller particle diameter of the entire crystal grains in the entire area of the metal plate, the maximum particle diameter of 95% of the crystal grains may be 11 μm or less.

Referring to FIGS. 3, 4 and 7, in case of the metal plate according to the second embodiment, it may be seen that a number of pits generated from the surface of the metal plate after the surface treatment is small and a size of pits is small.

On the other hand, referring to FIGS. 5, 6 and 8, in case of the metal plate according to the comparative example, it may be seen that a number of pits generated from the surface of the metal plate after the surface treatment is increased as compared with the embodiment, and a size of pits formed is larger than that of the embodiment.

That is, referring to FIGS. 11 and 12, it may be seen that in the metal plate according to the comparative example, the number of pits may be increased rapidly from a region in which a particle diameter of crystal grains exceeds 30 μm, and the size of pits is increased.

That is, it may be seen that the region in which the particle diameter of crystal grains exceeds 30 μm in FIG. 11 is a region in which a lot of pits are generated.

Control of Quantity of Crystal Grains of Metal Plate Per Unit Area

Subsequently, with reference to FIG. 13, it will be described that a surface pit is reduced by controlling a quantity per unit area of a plurality of crystal grains forming a metal plate 10 according to a second embodiment.

Meanwhile, FIGS. 3, 4 and 7 are views illustrating photographs before and after surface treatment of a metal plate according to the second embodiment, and FIGS. 5, 6 and 8 are views illustrating photographs before and after surface treatment of a metal plate according to a comparative example for comparison with the metal plate according to the second embodiment.

In the metal plate 10 according to the second embodiment, the quantity per unit area of the plurality of crystal grains may be controlled to be a predetermined size.

At this time, for the quantity of crystal grains per unit area, an area of 1 μm*1 μm was defined as the unit area after measuring a number of entire crystal grains in an area of 300 μm*300 μm out of the surface of the entire metal plate, and the quantity of crystal grains per unit area was measured.

Specifically, the entire quantity and the quantity per unit area of the crystal grains according to the second embodiment and the comparative example are as shown in Table 5.

TABLE 5

| | Quantity of crystal grains (ea) | Quantity of crystal grains per unit area (ea/μm²) |
|---|---|---|
| Exemplary Embodiment | 20000~21000 | 0.20~0.25 |
| Comparative Example | 10000~13000 | 0.10~0.15 |

Referring to Table 5, it may be seen that the quantity per unit area of the crystal grains of the metal plate according to the second embodiment is larger than the quantity per unit area of the crystal grains of the metal plate according to the comparative example.

That is, a large quantity of crystal grains per unit area may mean that a lot of crystal grains having small areas are distributed. That is, it may be seen that the crystal grains of the metal plate according to the second embodiment are distributed more in number than the crystal grains of the metal plate according to the comparative example.

Referring to FIGS. 3, 4 and 7, in case of the metal plate according to the second embodiment, it may be seen that a number of pits generated from the surface of the metal plate after the surface treatment is small and a size of pits is small.

On the other hand, referring to FIGS. 5, 6 and 8, in case of the metal plate according to the comparative example, it may be seen that a number of pits generated from the surface of the metal plate after the surface treatment is increased as compared with the second embodiment, and a size of pits formed is larger than that of the second embodiment.

That is, referring to FIG. 13, it may be seen that in the metal plate according to the comparative example, the number of pits increases as the particle diameter of the crystal grains increases, and the size of the pits increases.

The alloy metal plate of nickel and iron according to the second embodiment may reduce the number of pits generated after the surface treatment by controlling the area, particle diameter and size of the crystal grains.

Specifically, the maximum area of the crystal grains may be controlled to 700 μm2 or less, and the maximum particle diameter of the crystal grains may be controlled to 30 μm or less. In addition, the size of the crystal grains may be minimized to increase the quantity of crystal grains per unit area.

That is, a coarse density or a fine density of a surface formed by the crystal grains is increased by controlling the maximum area and particle diameter of the crystal grains to a predetermined size or less, and accordingly, it is possible to minimize formation of surface grooves, i.e. pits generated during an etching process of surface treatment.

Therefore, when manufacturing a deposition mark using the metal plate, it is possible to make uniform characteristics such as a diameter, a shape and a depth of through-holes formed in the metal plate, thereby improving deposition efficiency of the deposition mark and preventing deposition failures.

Meanwhile, the deposition mask 100 according to the embodiments described above may be manufactured using the metal plate 10 described above. Hereinafter, the deposition mask 100 according to embodiments will be described with reference to drawings.

FIGS. 14 to 16 are conceptual diagrams for describing a process of depositing an organic material on a substrate 300 by using a deposition mask 100 according to an embodiment.

FIG. 14 is a view illustrating an organic material deposition apparatus in which the deposition mask 100 according to the embodiment is included, and FIG. 15 is a view illustrating that the deposition mask 100 according to the embodiment is pulled to be placed on a mask frame 200. In addition, FIG. 16 is a view illustrating that a plurality of deposition patterns are formed on the substrate 300 through a plurality of through-holes of the deposition mask 100.

Referring to FIGS. 14 to 16, the organic material deposition apparatus may include a deposition mask 100, a mask frame 200, a substrate 300, an organic material deposition container 400, and a vacuum chamber 500.

The deposition mask 100 may include a metal. For example, the deposition mask 100 may have the same composition as the metal plate 10 described above. Specifically, the deposition mask 100 may be an invar including iron (Fe) and nickel (Ni). More specifically, the deposition mask 100 may include an invar including about 63.5 to 64.5 wt % of iron and about 35.5 to 36.5 wt % of nickel.

The deposition mask 100 may include an effective portion for deposition, and the effective portion may have a plurality of through-holes TH. The deposition mask 100 may be a substrate for deposition mask including the plurality of through-holes TH. At this point, the through-hole may be formed to correspond to patterns to be formed on the substrate. The through-hole TH may be formed not only in an effective region positioned in the center of the effective portion, but also in an outer region positioned at an outer portion of the effective portion and surrounding the effective region. The deposition mask 100 may include an ineffective portion other than the effective portion including a deposition region. The through-hole may not be positioned in the ineffective portion.

The mask frame 200 may include an opening. The plurality of through-holes of the deposition mask 100 may be disposed on a region corresponding to the opening. Accordingly, organic material supplied to the organic material deposition container 400 may be deposited on the substrate 300. The deposition mask 100 may be disposed and fixed on the mask frame 200. For example, the deposition mask 100 may be pulled at a predetermined tensile force to be fixed on the mask frame 200 by welding.

The deposition mask 100 may be pulled in opposite directions at an end disposed on the outermost portion of the deposition mask 100. In the deposition mask 100, one end of the deposition mask 100 and the other end opposite to the one end may be pulled in opposite directions in a longitudinal direction of the deposition mask 100. The one end and the other end of the deposition mask 100 may face each other and be disposed in parallel.

The one end of the deposition mask 100 may be one of end portions forming four side surfaces disposed on the outermost portion of the deposition mask 100. For example, the deposition mask 100 may be pulled at a tensile force of 0.1 kgf to 2 kgf. Specifically, the deposition mask 100 may be pulled at a tensile force of 0.4 kgf to 1.5 kgf. Accordingly, the pulled deposition mask 100 may be fixed on the mask frame 200.

Then, the deposition mask 100 may be fixed to the mask frame 200 by welding the ineffective portion of the deposition mask 100. Subsequently, a portion of the deposition mask 100 disposed outside the mask frame 200 may be removed by a method such as cutting.

The substrate 300 may be a substrate used for manufacturing a display device. For example, the substrate 300 may be a substrate 300 for depositing an organic material for an OLED pixel pattern. Organic material patterns of red (R), green (G), and blue (B) may be formed on the substrate 300 to form a pixel that is three primary colors of light. That is, an RGB pattern may be formed on the substrate 300. Although not shown in drawings, an organic material pattern of white (W) in addition to the organic material patterns of red (R), green (G), and blue (B) may be further formed on the substrate 300. That is, an WRGB pattern may be formed on the substrate 300.

The organic material deposition container 400 may be a crucible. An organic material may be disposed at an inside of the crucible.

As a heat source and/or current is supplied to the crucible in the vacuum chamber 500, the organic material may be deposited on the substrate 300.

Referring to FIG. 16, the deposition mask 100 may include one surface 101 and the other surface 102 opposite to the one surface.

The one surface 101 of the deposition mask 100 may include a small surface hole V1, and the other surface 102 of the deposition mask 100 may include a large surface hole V2. The through-hole TH may be communicated by a communication portion CA to which the boundary of the small surface hole V1 and the large surface hole V2 is connected.

The deposition mask 100 may include a first inner side surface ES1 in the small surface hole V1. The deposition mask 100 may include a second inner side surface ES2 in the large surface hole V2. The through-hole may be formed by communicating the first inner side surface ES1 in the small surface hole V1 and the second inner side surface ES2 in the large surface hole V2. For example, the first inner side surface ES1 in one small surface hole V1 may communicate with the second inner side surface ES2 in one large surface hole V2 to form one through-hole.

A width of the large surface hole V2 may be greater than that of the small surface hole V1. At this time, the width of the small surface hole V1 may be measured at one surface 101, and the width of the large surface hole V2 may be measured at the other surface 102.

The small surface hole V1 may be disposed toward the substrate 300. The small surface hole V1 may be disposed close to the substrate 300. Accordingly, the small surface hole V1 may have a shape corresponding to a deposition material, that is, a deposition pattern DP.

The large surface hole V2 may be disposed toward the organic material deposition container 400. Accordingly, the large surface hole V2 may accommodate the organic material supplied from the organic material deposition container 400 in a wide width, and a fine pattern may be formed quickly on the substrate 300 through the small surface hole V1 having a width smaller than that of the large surface hole V2.

FIG. 17 is view illustrating a plan view of a deposition mask 100 according to an embodiment. Referring to FIG. 17, the deposition mask 100 according to the embodiment may include a deposition pattern region DA and a non-deposition region NDA.

The deposition region DA may be a region for forming a deposition pattern. The deposition region DA may include an effective portion forming a deposition pattern. The deposition region DA may include a pattern region and a non-pattern region.

The pattern region may be a region including a small surface hole V1, a large surface hole V2, a through-hole TH, and an island portion IS, and the non-pattern region may be a region not including the small surface hole V1, the large surface hole V2, the through-hole TH, and the island portion IS. Here, the deposition region DA may include an effective portion including an effective region and an outer region which will be described later, and an ineffective portion in which deposition does not performed. Accordingly, the effective portion may be the pattern region, and the ineffective portion may be the non-pattern region.

In addition, one deposition mask 100 may include a plurality of deposition regions DA. For example, the deposition region DA of an embodiment may include a plurality of effective portions capable of forming a plurality of deposition patterns. The effective portion may include a plurality of effective regions AA1, AA2, and AA3.

The plurality of effective regions AA1, AA2, and AA3 may be disposed in the central region of the effective portion. The plurality of effective regions AA1, AA2, and AA3 may include a first effective region AA1, a second effective region AA2, and a third effective region AA3. Here, one deposition region DA may be a first effective portion including the first effective region AA1 and a first outer region OA1 surrounding the first effective region AA1.

In addition, one deposition region DA may be a second effective portion including the second effective region AA2 and a second outer region OA2 surrounding the second effective region AA2. Further, one deposition region DA may be a third effective portion including the third effective region AA3 and a third outer region OA3 surrounding the third effective region AA3.

In case of a small-sized display device such as a smartphone, an effective portion of any one of a plurality of deposition regions included in the deposition mask 100 may be one for forming one display device. Accordingly, one deposition mask 100 may include a plurality of effective portions to form a plurality of display devices at the same time. Therefore, the deposition mask 100 according to an embodiment may improve process efficiency.

Alternatively, in case of a large-sized display device such as a television, a plurality of effective portions included in one deposition mask 100 may be a part for forming one display device. In this case, the plurality of effective portions may be for preventing deformation due to a load of the mask.

The plurality of effective regions AA1, AA2, and AA3 may be disposed to be spaced apart from each other. Specifically, the plurality of effective regions AA1, AA2, and AA3 may be disposed to be spaced apart in the major axis direction of the deposition mask 100. The deposition region DA may include a plurality of isolation regions IA1 and IA2 included in one deposition mask 100. The isolation regions IA1 and IA2 may be disposed between adjacent effective portions.

The isolation regions IA1 and IA2 may be spaced regions between the plurality of effective portions. For example, a first isolation region IA1 may be disposed between the first outer region OA1 surrounding the first effective region AA1 and the second outer region OA2 surrounding the second effective region AA2. In addition, a second isolation region IA2 may be disposed between the second outer region OA2 surrounding the second effective region AA2 and the third outer region OA3 surrounding the third effective region AA3. That is, the adjacent effective portions may be distinguished from each other by the isolation regions IA1 and IA2, and the plurality of effective portions may be supported by one deposition mask 100.

The deposition mask 100 may include a non-deposition region NDA on both side portions in a longitudinal direction of the deposition region DA. The deposition mask 100 according to an embodiment may include the non-deposition region NDA on both sides in a horizontal direction of the deposition region DA.

The non-deposition region NDA of the deposition mask 100 may be a region not involved in a deposition. The non-deposition region NDA may include frame fixing regions FA1 and FA2 for fixing the deposition mask 100 to a mask frame 200. In addition, the non-deposition region NDA may include grooves G1 and G2 and an open portion.

As described above, the deposition region DA may be a region for forming a deposition pattern, and the non-deposition region NDA may be a region not involved in deposition. In this case, a surface treatment layer different from a material of the metal plate 10 may be formed in the deposition region DA of the deposition mask 100, and the surface treatment layer may not be formed in the non-deposition region NDA.

Alternatively, the surface treatment layer different from the material of the metal plate 10 may be formed on only any one of one surface 101 or the other surface 102 opposite to the one surface 101 of the deposition mask 100.

Alternatively, the surface treatment layer different from the material of the metal plate 10 may be formed only on a portion of the one surface 101 of the deposition mask 100.

For example, the one surface and/or the other surface of the deposition mask 100, and the entire and/or a portion of the deposition mask 100 may include a surface treatment layer having a lower etch rate than that of the material of the metal plate 10, thereby improving an etching factor. Accordingly, the deposition mask 100 according to an embodiment may form a through-hole having a fine size with high efficiency.

As an example, the deposition mask 100 of the embodiment may have a resolution of 400 PPI or more. In detail, the deposition mask 100 may form a deposition pattern having a high resolution of 500 PPI or more with high efficiency.

Here, the surface treatment layer may include a material different from the material of the metal plate 10, or may include a metal material having a different composition of the same element. In this regard, it will be described in more detail in a manufacturing process of the deposition mask described later.

The non-deposition region NDA may include the grooves G1 and G2. For example, the non-deposition region NDA of the deposition mask 100 may include a first groove G1 on one side of the deposition region DA, and may include a second groove G2 on the other side opposite to the one side of the deposition region DA.

The first groove G1 and the second groove G2 may be regions in which grooves are formed in a depth direction of the deposition mask 100. Since the first groove G1 and the second groove G2 may have a groove having a thickness of about ½ of the deposition mask, it is possible to disperse a stress when the deposition mask 100 is pulled. In addition, it is preferable to form the grooves G1 and G2 to be symmetric in an X-axis direction or in a Y-axis direction with respect to a center of the deposition mask 100. Through the same, it is possible to equalize a tensile force in both directions.

The grooves G1 and G2 may be formed in various shapes. The grooves G1 and G2 may include a semi-circular shaped groove. The grooves G1 and G2 may be formed on at least one of one surface 101 of the deposition mask 100 and the other surface 102 opposite to the one surface 101. Preferably, the grooves G1 and G2 may be formed on the one surface 101 corresponding to a small surface hole V1.

Accordingly, since the grooves G1 and G2 may be formed at the same time with the small surface hole V1, process efficiency may be improved. In addition, the grooves G1 and G2 may disperse a stress that may be generated due to a difference in size between large surface holes V2. However, the embodiment is not limited thereto, the grooves G1 and G2 may have a quadrilateral shape. For example, the first groove G1 and the second groove G2 may have a rectangular or square shape. Accordingly, the deposition mask 100 may effectively disperse a stress.

In addition, the grooves G1 and G2 may include a curved surface and a flat surface. The flat surface of the first groove G1 may be disposed to be adjacent to the first effective region AA1, and the flat surface may be disposed horizontally with an end in a longitudinal direction of the deposition mask 100. The curved surface of the first groove G1 may have a convex shape toward one end in the longitudinal direction of the deposition mask 100. For example, the curved surface of the first groove G1 may be formed such that a ½ point of a length in a vertical direction of the deposition mask 100 corresponds to the radius of a semicircular shape.

In addition, the flat surface of the second groove G2 may be disposed to be adjacent to the third effective region AA3, and the flat surface may be disposed horizontally with an end in a longitudinal direction of the deposition mask 100. The curved surface of the second groove G2 may have a convex shape toward the other end in the longitudinal direction of the deposition mask 100. For example, the curved surface of the second groove G2 may be formed such that a ½ point of a length in a vertical direction of the deposition mask 100 corresponds to the radius of a semicircular shape.

The grooves G1 and G2 may be formed simultaneously when the small surface hole V1 or the large surface hole V2 is formed. Through the same, process efficiency may be improved. In addition, the grooves G1 and G2 formed on the one surface 101 and the other surface 102 of the deposition mask 100 may be formed so as to be displaced from each other. Through the same, the grooves G1 and G2 may not be passed through.

In addition, the deposition mask 100 according to the embodiment may include four half etching portions. For example, the grooves G1 and G2 may include an even number of grooves G1 and G2 to more efficiently disperse a stress.

In addition, the grooves G1 and G2 may be further formed in an ineffective portion UA of the deposition region DA. For example, the grooves G1 and G2 may be disposed in plural and dispersed in all or a part of the ineffective portion UA in order to disperse a stress when the deposition mask 100 is pulled.

That is, the deposition mask 100 according to the embodiment may include a plurality of grooves. In detail, the deposition mask 100 according to the embodiment is illustrated as including grooves G1 and G2 only in the non-deposition region NDA, but the embodiment is not limited thereto, and the deposition mask 100 may further include the plurality of grooves in at least one of the deposition region DA and the non-deposition region NDA. Accordingly, the stress of the deposition mask 100 may be uniformly dispersed.

The non-deposition region NDA may include the frame fixing regions FA1 and FA2 for fixing the deposition mask 100 to the mask frame 200. For example, a first frame fixing region FA1 may be included on one side of the deposition region DA, and a second frame fixing region FA2 may be included on the other side opposite to the one side of the deposition region DA. The first frame fixing region FA1 and the second frame fixing region FA2 may be regions fixed to the mask frame 200 by welding.

The frame fixing regions FA1 and FA2 may be disposed between the grooves G1 and G2 of the non-deposition region NDA and the effective portion of the deposition region DA adjacent to the grooves G1 and G2.

For example, the first frame fixing region FA1 may be disposed between the first groove G1 of the non-deposition region NDA and the first effective portion including the first effective region AA1 and the first outer region OA1 of the deposition region DA adjacent to the first groove G1.

For example, the second frame fixing region FA2 may be disposed between the second groove G2 of the non-deposition region NDA and the third effective portion including the third effective region AA3 and the third outer region OA3 of the deposition region DA adjacent to the second groove G2. Accordingly, it is possible to simultaneously fix a plurality of deposition pattern portions.

In addition, the deposition mask 100 may include a semicircular shaped open portion at both ends in a horizontal direction X. The non-deposition region NDA of the deposition mask 100 may include one semicircular shaped open portion at each of both ends in a horizontal direction. For example, the non-deposition region NDA of the deposition mask 100 may include an open portion of which a center in a vertical direction Y is opened on one side in the horizontal direction.

For example, the non-deposition region NDA of the deposition mask 100 may include the open portion of which the center in the vertical direction is opened on the other side opposite to the one side in the horizontal direction. That is, both ends of the deposition mask 100 may include the open portion at ½ point of a length in the vertical direction. For example, both ends of the deposition mask 100 may be shaped like a horseshoe.

In this case, a curved surface of the open portion may be directed to the grooves G1 and G2. Accordingly, the open portion positioned at both ends of the deposition mask 100 may have the shortest separation distance at a ½ point of a length in the vertical direction of the first groove G1 or the second groove G2 and the deposition mask 100.

In addition, a length d1 in a vertical direction of the first groove G1 or the second groove G2 may correspond to a length d2 in a vertical direction of the open portion. Accordingly, when the deposition mask 100 is pulled, a stress may be uniformly dispersed, so that the deformation (wave deformation) of the deposition mask 100 may be reduced.

Therefore, the deposition mask 100 according to the embodiment may have a uniform through-hole, so that the deposition efficiency of the pattern may be improved. Preferably, the length d1 in the vertical direction of the first groove G1 or the second groove G2 may be about 80% to 200% of the length d2 in the vertical direction of the open portion (d1:d2=0.8 to 2:1).

The length d1 in the vertical direction of the first groove G1 or the second groove G2 may be about 90% to about 150% of the length d2 in the vertical direction of the open portion (d1:d2=0.9 to 1.5:1).

The length d1 in the vertical direction of the first groove G1 or the second groove G2 may be about 95% to about 110% of the length d2 in the vertical direction of the open portion (d1:d2=0.95 to 1.1:1).

In addition, although not shown in the drawings, the grooves G1 and G2 may be further formed in an ineffective portion UA of the deposition region DA. For example, the grooves may be disposed in a plural and dispersed in all or part of the ineffective portion UA in order to disperse a stress when the deposition mask 100 is pulled.

Further, the grooves G1 and G2 may be formed in the frame fixing regions FA1 and FA2 and/or a peripheral region of the frame fixing regions FA1 and FA2. Accordingly, a stress of the deposition mask 100 occurring when depositing a deposition material when the deposition mask 100 is fixed to the mask frame 200 and/or after the deposition mask 100 is fixed to the mask frame 200, may be uniformly dispersed. Accordingly, the grooves G1 and G2 may maintain so that the deposition mask 100 may have uniform through-holes.

The deposition mask 100 may include a plurality of effective portions spaced in the longitudinal direction and an ineffective portion UA other than the effective portion. In detail, the deposition region DA may include a plurality of effective portions and the ineffective portion UA other than the effective portion.

The plurality of effective portions may include a first effective portion, a second effective portion, and a third effective portion.

In addition, the first effective portion may include a first effective region AA1 and a first outer region OA1 surrounding the first effective region AA1. The second effective portion may include a second effective region AA2 and a second outer region OA2 surrounding the second effective region AA2. The third effective portion may include a third effective region AA3 and a third outer region OA3 surrounding the third effective region AA3.

The effective portions may include a plurality of small surface holes V1 formed on one surface of the deposition mask 100, a plurality of large surface holes V2 formed on the other surface opposite to the one surface, and a through-hole TH formed by a communication portion CA in which a boundary between the small surface hole and the large surface hole is connected.

In addition, the effective regions AA1, AA2, and AA3 may include an island portion IS supporting between the plurality of through-holes TH.

The island portion IS may be positioned between adjacent through-holes TH among the plurality of through-holes. That is, a region other than the through-holes TH may be an island portion IS in the effective regions AA1, AA2, and AA3 of the deposition mask 100.

The island portion IS may refer to a portion which is not etched in one surface 101 or the other surface 102 of the effective portion of the deposition mask 100. In detail, the island portion IS may be a non-etched region between the through-hole and the through-hole on the other surface 102 on which the large surface hole V2 of the effective portion of the deposition mask 100 is formed. Therefore, the island portion IS may be disposed in parallel with the one surface 101 of the deposition mask 100.

The island portion IS may be disposed coplanar with the other surface 102 of the deposition mask 100. Accordingly, the island portion IS may have the same thickness as at least a portion of the ineffective portion UA on the other surface 102 of the deposition mask 100. In detail, the island portion IS may have the same thickness as a non-etched portion of the ineffective portion on the other surface 102 of the deposition mask 100. Accordingly, deposition uniformity of a sub-pixel may be improved through the deposition mask 100.

Alternatively, the island portion IS may be disposed in a flat surface parallel to the other surface 102 of the deposition mask 100. Here, the parallel flat surface may include that a step in height of the other surface 102 of the deposition mask 100 in which the island portion IS is disposed and the other surface 102 of the non-etched deposition mask 100 of the ineffective portions is ±1 μm or less by an etching process around the island portion IS.

The island portion IS may have a polygonal shape. Alternatively, the island portion IS may have a curved figure shape. That is, when viewed in plan from the other surface 102 of the deposition mask 100, the island portion IS may have a polygonal or curved figure shape.

For example, an upper surface of the island portion IS may have a polygonal shape or a curved figure shape. That is, the island portion IS may have a planar shape of the polygonal shape or curved figure shape. The curved figure shape may mean a shape having at least one variation curve while being a polygon having a plurality of sides and inner angles. For example, when viewed in plan, the island portion IS may include a plurality of curves, and may be a curved figure shape to which the curves are connected. That is, the upper surface of the island portion IS may have a polygonal shape or a curved figure shape by an etching process for forming the large surface hole V2.

The deposition mask 100 may be disposed surrounding the effective regions AA1, AA2, and AA3, and may include the outer regions OA1, OA2, and OA3 disposed at outer peripheries of the effective regions AA1, AA2, and AA3. The effective region AA may be an inner region when outer peripheries of through-holes positioned at the outermost portion for depositing an organic material among a plurality of through-holes are connected.

The ineffective region UA may be an outer region when the outer periphery of the through-holes positioned at the outermost portion for depositing the organic material among the plurality of through-holes is connected. For example, the ineffective region UA may be an outer region when the outer periphery of the through-holes positioned at the outermost portion in the outer region OA is connected The ineffective region UA is the effective regions AA1, AA2, and AA3 of the deposition pattern region DA, a region excluding the effective region including the outer regions OA1, OA2, and OA3 surrounding the effective region, and the non-deposition region NDA. The first effective region AA1 may be positioned in a first outer region OA1. The first effective region AA1 may include a plurality of through-holes for forming a deposition material. The first outer region OA1 surrounding the outer periphery of the first effective region AA1 may include a plurality of through-holes For example, the plurality of through-holes included in the first outer region OA1 is for reducing etching failure of the through-holes TH positioned at the outermost portion of the first effective region AA1. Accordingly, the deposition mask 100 according to the embodiment may improve the uniformity of the plurality of through-holes TH positioned in the effective regions AA1, AA2, and AA3, and may improve the quality of the deposition pattern produced through the same.

In addition, a shape of the through-hole TH of the first effective region AA1 may correspond to a shape of the through-hole of the first outer region OA1. Accordingly, uniformity of the through-hole TH included in the first effective region AA1 may be improved.

As an example, the shape of the through-hole TH of the first effective portion AA1 and the shape of the through-hole of the first outer region OA1 may be in a circular shape. However, the embodiment is not limited thereto, and the through-hole TH may have various shapes such as a diamond pattern, an oval pattern, and the like.

The second effective portion AA2 may be positioned in the second outer region OA2. The second effective portion AA2 may have a shape corresponding to the first effective portion AA1. The second outer region OA2 may have a shape corresponding to the first outer region OA1.

The second outer region OA2 may further include two through-holes in the horizontal direction and the vertical direction, respectively, from the through-hole positioned at the outermost portion of the second effective portion AA2. For example, in the second outer region OA2, two through-holes may be disposed in a row in the horizontal direction at an upper and a lower portion of the through-hole positioned at the outermost portion of the second effective portion AA2, respectively.

For example, in the second outer region OA2, two through-holes may be disposed in a line in the vertical direction at the left side and the right side of the through-hole positioned at the outermost portion of the second effective portion AA2, respectively. The plurality of through-holes included in the second outer region OA2 is for reducing etching failure of the through-holes positioned at the outermost portion of the effective portion. Accordingly, the deposition mask according to the embodiment may improve the uniformity of the plurality of through-holes positioned in the effective portion, and may improve the quality of the deposition pattern manufactured through the same.

The third effective region AA3 may be included in the third outer region OA3. The third effective region AA3 may include a plurality of through-holes for forming a deposition material. The third outer region OA3 surrounding the outer periphery of the third effective region AA3 may include a plurality of through-holes.

The third effective region AA3 may be in a shape corresponding to that of the first effective region AA1. The third outer region OA3 may be in a shape corresponding to that of the first outer region OA1.

In addition, the through-holes TH included in the effective regions AA1, AA2, and AA3 may have a shape partially corresponding to that of the through-holes included in the outer regions OA1, OA2, and OA3. As an example, the through-holes included in the effective regions AA1, AA2, and AA3 may have a different shape from that of through-holes positioned at edge portions of the outer regions OA1, OA2, and OA3. Accordingly, it is possible to adjust a difference in stress according to a position of the deposition mask 100.

FIG. 18 is a view illustrating a plan view of an effective region of a deposition mask 100 according to an embodiment, and FIG. 19 is a view illustrating another plan view of a deposition mask according to an embodiment.

FIGS. 18 and 19 may be plan views of any one of a first effective region AA1, a second effective region AA2, and a third effective region AA3 of the deposition mask 100 according to the embodiment. In addition, FIGS. 18 and 19 are views for describing a shape of through-holes TH and arrangement between the through-holes TH. The deposition mask 100 according to the embodiment is not limited to a number of the through-holes TH shown in the drawings.

Referring to FIGS. 18 and 19, the deposition mask 100 may include a plurality of through-holes TH. At this point, the through-holes TH may be disposed in a row or disposed to cross each other according to a direction. For example, the through-holes TH may be disposed in a row on the vertical axis and the horizontal axis, and may be disposed in a row on the vertical axis or the horizontal axis.

Referring to FIGS. 18 and 19, the deposition mask 100 may include the plurality of through-holes TH. At this point, the plurality of through-holes TH may have a circular shape. In detail, a diameter Cx in the horizontal direction and a diameter Cy in the vertical direction of the through-hole TH may correspond to each other.

The through-holes TH may be disposed in a row according to a direction. For example, the through-holes TH may be disposed in a row in the vertical axis and the horizontal axis.

A first through-hole TH1 and a second through-hole TH2 may be disposed in a row in the horizontal axis, and the third through-hole TH3 and the fourth through-hole TH4 may be disposed in a row in the horizontal axis.

The first through-hole TH1 and the third through-hole TH3 may be disposed in a row in the vertical axis, and the second through-hole TH2 and the fourth through-hole TH4 may be disposed in a row in the horizontal axis.

That is, when the through-holes TH are disposed in a row in the vertical axis and the horizontal axis, an island portion IS is placed between two through-holes TH that are adjacent to each other in the diagonal direction, in which both the vertical axis and the horizontal axis intersect. That is, the island portion IS may be position between two adjacent through-holes TH that are positioned in the diagonal direction to each other.

For example, the island portion IS may be disposed between the first through-hole TH1 and the fourth through-hole TH4. Further, the island portion IS may be disposed between the second through-hole TH2 and the third through-hole TH3. The island portion IS may be disposed in an inclination angle direction of about +45 degrees and an inclination angle direction of about −45 degrees with respect to the horizontal axis crossing two adjacent through-holes. Here, an inclination angle direction of about ±45 may mean a diagonal direction between the horizontal axis and the vertical axis, and the diagonal inclination angle is measured on the same plane of the horizontal axis and the vertical axis.

In addition, referring to FIG. 19, the deposition mask 100 according to the embodiment may include a plurality of through-holes TH. At this point, the plurality of through-hole may have an elliptical shape. In detail, the diameter Cx in the horizontal direction of the through-hole TH and the diameter Cy in the vertical direction may be different from each other. For example, the diameter Cx in the horizontal direction of the through-hole may be larger than the diameter Cy in the vertical direction. However, the embodiment is not limited thereto, and the through-hole may have a rectangular shape, an octagonal shape, or a rounded octagonal shape.

The through-holes TH are disposed in a row on any one of the vertical axis or the horizontal axis, and may be disposed to cross each other on one axis.

Specifically, the first through-hole TH1 and the second through-hole TH2 may be disposed in a row on the horizontal axis. The third through-hole TH3 and the fourth through-hole TH4 may be disposed to cross the first through-hole TH1 and the second through-hole TH2 on the vertical axis, respectively.

When the through-holes TH are disposed in a row in any one direction of the vertical axis and the horizontal axis, and cross in the other direction, the island portion IS may be positioned between two adjacent through-holes TH1 and TH2 in the other direction of the vertical axis and the horizontal axis. Alternatively, the island portion IS may be positioned between three through-holes TH1, TH2, and TH3 adjacent to each other. Two through-holes TH1 and TH2 of the three adjacent through-holes TH1, TH2, and TH3 are through-holes disposed in a row, and the remaining one through-hole TH3 may refer to a through-hole that may be disposed in a region between the two through-holes TH1 and TH2 at an adjacent position in a direction corresponding to the direction of the row. The island portion IS may be disposed between the first through-hole TH1, the second through-hole TH2, and the third through-hole TH3. Alternatively, the island portion IS may be disposed between the second through-hole TH2, the third through-hole TH3, and the fourth through-hole TH4.

In addition, in the deposition mask 100 according to the embodiment, in the case of measuring a diameter Cx in the horizontal direction and a diameter Cy in the vertical direction of a reference hole which is any one of through-holes, a deviation between the diameters Cx in the horizontal direction and a deviation between the diameters Cy in the vertical direction of each of through-holes TH adjacent to the reference hole may be realized as 2% to 10%. That is, when a size deviation between the adjacent holes of one reference hole is realized as 2% to 10%, deposition uniformity may be secured. For example, the size deviation between the reference hole and the adjacent holes may be 4% to 9%.

For example, the size deviation between the reference hole and the adjacent holes may be 5% to 7%. For example, the size deviation between the reference hole and the adjacent holes may be 2% to 5%. When the size deviation between the reference hole and the adjacent holes is less than 2%, an occurrence ratio of moire in an OLED panel after deposition may be increased. When the size deviation between the reference hole and the adjacent holes is more than 10%, an occurrence ratio of color unevenness in the OLED panel after deposition may be increased. An average deviation of the diameters of the through-holes may be ±5 μm. For example, the average deviation of the diameters of the through-holes may be ±3 μm. For example, the average deviation of the diameters of the through-holes may be ±1 μm. In the embodiment, deposition efficiency may be improved by realizing the size deviation between the reference hole and the adjacent holes within ±3 μm.

The island portion IS of FIGS. 18 and 19 may refer to a non-etched surface between the through-holes TH in the other surface of the deposition mask 100 in which the large surface hole V2 of the effective portion AA is formed. In detail, the island portion IS may be the other surface of the non-etched deposition mask 100 except the second inner side surface ES2 and the through-hole TH positioned in the large surface hole in the effective portion AA of the deposition mask. The deposition mask 100 of an embodiment may be for deposition of OLED pixels of high resolution to ultra-high resolution having a resolution of 400 PPI or more, in detail, 400 PPI to 800 PPI or more.

For example, the deposition mask 100 of the embodiment may be for forming a deposition pattern having high resolution of full high definition (HD) having a resolution of 400 PPI or more. For example, the deposition mask 100 of the embodiment may be for deposition of OLED pixels having a pixel number of 1920*1080 or more in the horizontal direction and the vertical direction, and a resolution of 400 PPI or more. That is, one effective portion included in the deposition mask of the embodiment may be for forming a pixel number with a resolution of 1920*1080 or more.

For example, the deposition mask 100 of the embodiment may be for forming a deposition pattern having high resolution of quad high definition (QHD) having a resolution of 500 PPI or more. For example, the deposition mask 100 of the embodiment may be for the deposition of OLED pixels having a pixel number of 2560*1440 or more in the horizontal direction and the vertical direction and a resolution of 530 PPI or more. According to the deposition mask 100 of the embodiment, a number of pixels per inch may be 530 PPI or more based on a 5.5 inch OLED panel. That is, one effective portion included in the deposition mask 100 of the embodiment may be for forming a pixel number with a resolution of 2560*1440 or more.

For example, the deposition mask 100 of the embodiment may be for forming a deposition pattern having ultra-high resolution of ultra-high definition (UHD) having a resolution of 700 PPI or more. For example, the deposition mask 100 of the embodiment may be for forming a deposition pattern having UHD-class resolution for the deposition of OLED pixels having a pixel number of 3840*2160 or more in the horizontal direction and the vertical direction and a resolution of 794 PPI or more.

A diameter of the through-hole TH may be a width between the communication portions CA. In detail, the diameter of the through-hole TH may be measured at the point in which an end of the etching surface in the small surface hole V1 meets an end of the etching surface in the large surface hole V2. A measuring direction of the diameter of the through-hole TH may be any one of a horizontal direction, a vertical direction, and a diagonal direction. The diameter of the through-hole TH measured in the horizontal direction may be 33 μm or less. Alternatively, the diameter of the through-hole TH measured in the horizontal direction may be 33 μm or less. Alternatively, the diameter of the through-hole TH may be an average value of values measured in the horizontal direction, the vertical direction, and the diagonal direction, respectively.

Accordingly, the deposition mask 100 according to the embodiment may implement a QHD-class resolution. For example, the diameter of the through-hole TH may be 15 μm to 33 μm. For example, the diameter of the through-hole TH may be 19 μm to 33 μm. For example, the diameter of the through-hole TH may be 20 μm to 27 μm. When the diameter of the through-hole TH exceeds 33 μm, it may be difficult to implement a resolution of 500 PPI or more. On the other hand, when the diameter of the through-hole TH is less than 15 μm, a deposition failure may occur.

Referring to FIGS. 18 and 19, a pitch between two adjacent through-holes TH among the plurality of through-holes in the horizontal direction may be 48 μm or less. For example, the pitch between two adjacent through-holes TH among the plurality of through-holes TH in the horizontal direction may be 20 μm to 48 μm.

For example, the pitch between two adjacent through-holes TH among the plurality of through-holes TH in the horizontal direction may be 30 μm to 35 μm. Here, the pitch may refer to a pitch P1 between a center of a first through-hole TH1 and a center of a second through-hole TH2, which are adjacent in the horizontal direction. Alternatively, the pitch may refer to a pitch P2 between a center of a first island portion and a center of a second island portion, which are adjacent in the horizontal direction. Here, the center of the island portion IS may be a center at the non-etched other surface between four adjacent through-holes TH in the horizontal direction and the vertical direction.

For example, the center of the island portion IS, based on the first through-hole TH1 and the second through-hole TH2 which are adjacent in the horizontal direction, may refer to a point at which the horizontal axis and the vertical axis connecting the edges of one island portion IS positioned in a region between the third through-hole TH3 vertically adjacent to the first through-hole TH1 and the fourth through-hole TH4 vertically adjacent to the second through-hole TH2 intersect.

In addition, referring to FIGS. 18 and 19, a pitch between two adjacent through-holes TH among the plurality of through-holes in the horizontal direction may be 48 μm or less. For example, the pitch between two adjacent through-holes TH among the plurality of through-holes TH in the horizontal direction may be 20 μm to 48 μm.

For example, the pitch between two adjacent through-holes TH among the plurality of through-holes TH in the horizontal direction may be 30 μm to 35 μm. Here, the pitch may refer to a pitch P1 between a center of a first through-hole TH1 and a center of a second through-hole TH2, which are adjacent in the horizontal direction.

In addition, the pitch may refer to a pitch P2 between a center of a first island portion and a center of a second island portion, which are adjacent in the horizontal direction. Here, the center of the island portion IS may be a center at the non-etched other surface between four adjacent through-holes in the horizontal direction and the vertical direction.

Alternatively, here, the center of the island portion IS may be a center at the non-etched other surface between two through-holes and one through-hole adjacent in the vertical direction. That is, the center of the island portion IS may be a center of the non-etched surface between three adjacent through-holes, and the three adjacent through-holes may refer that a triangular shape may be formed when the centers are connected.

The measuring direction of the diameter of the through-hole TH and the measuring direction of a pitch between two through-holes TH may be the same. The pitch of the through-holes TH may be a value of measuring a pitch between two adjacent through-holes TH in the horizontal direction or the vertical direction.

That is, in the deposition mask 100 according to the embodiment, OLED pixels having a resolution of 400 PPI or more may be deposited. Specifically, in the deposition mask 100 according to the embodiment, the diameter of the through-holes TH is 33 μm or less, and the pitch between the through-holes TH is 48 μm or less, and thus OLED pixels having a resolution of 500 PPI or more may be deposited. More specifically, a green organic material having a resolution of 500 PPI or more may be deposited. That is, QHD-class resolution may be implemented using the deposition mask 100 according to the embodiment.

The diameter of the through-hole TH and the pitch between the through-holes TH may be a size for forming a green sub pixel. For example, the diameter of the through-hole TH may be measured based on a green (G) pattern. This is because since the G pattern has a low recognition rate through vision, a larger number is required than a red (R) and blue (B) patterns, and a pitch between the through-holes TH may be narrower than the R and B patterns. The deposition mask 100 may be an OLED deposition mask for implementing QHD display pixels.

For example, the deposition mask 100 may be for depositing at least one subpixel among red R, first green G1, blue B, and second green G2. In detail, the deposition mask 100 may be for depositing a red R subpixel. Alternatively, the deposition mask 100 may be for depositing a blue B subpixel. Alternatively, the deposition mask 100 may be for simultaneously forming a first green G1 subpixel and a second green G2 subpixel.

The pixel arrangement of an organic light emitting display device may be disposed in an order of "red R-first green G1-blue B-second green G2". In this case, red R-first green G1 may form one pixel RG, and blue B-second green G2 may form another pixel BG. In the organic light emitting display device having such an arrangement, since a deposition interval of a green light emitting organic material is narrower than that of a red light emitting organic material and a blue light emitting organic material, a form of deposition mask 100 like the present invention may be required.

In addition, in the deposition mask 100 according to the embodiment, the diameter of the through-hole TH in the horizontal direction may be 20 μm or less. Accordingly, the deposition mask 100 according to the embodiment may implement a UHD-class resolution. For example, in the deposition mask 100 according to the embodiment, the diameter of the through-hole TH is 20 μm or less, and the pitch between the through-holes TH is 32 μm or less, and thus OLED pixels having a resolution of 800 PPI class may be deposited. That is, UHD-class resolution may be implemented using the deposition mask according to the embodiment.

The diameter of the through-hole and the pitch between the through-holes may be a size for forming a green sub pixel. The deposition mask may be an OLED deposition mask for implementing UHD display pixels.

FIG. 20 is a view illustrating each cross section overlapped for describing a height step and a size between the cross section in the A-A' direction and the cross section in the B-B' direction of FIGS. 18 and 19.

First, the cross section in the A-A' direction of FIGS. 18 and 19 will be described. The A-A' direction is a cross section that crosses the center region between a first through-hole TH1 and a third through-hole TH3 adjacent in the vertical direction. That is, the cross section in the A-A' direction may not include the through-hole TH.

In the cross section in the A-A' direction, an island portion IS which is the other surface of a deposition mask that is not etched may be positioned between an etching surfaces ES2 in a large surface hole. Accordingly, the island portion IS may include a surface parallel to one unetched surface of the deposition mask. Alternatively, the island portion IS may include a surface that is the same as or parallel to the other unetched surface of the deposition mask.

Next, the cross section in the B-B' direction of FIG. 18 and FIG. 19 will be described. The B-B' direction is a cross section that crosses the center of each of the first through-hole TH1 and the second through-hole TH2 that are adjacent in the horizontal direction. That is, the cross section in the direction B-B' may include a plurality of through-holes TH.

One rib RB may be positioned between the third through-hole TH3 and the fourth through-hole TH4 adjacent in the direction B-B'. Another rib RB may be positioned between the fourth through-hole TH4 and a fifth through-hole that is adjacent to the fourth through-hole in a horizontal direction but is positioned in an opposite direction of the third through-hole TH3. One through-hole TH may be positioned between the one rib and the other rib. That is, one through-hole TH may be positioned between two ribs RB adjacent in the horizontal direction.

In addition, in the cross section in the B-B' direction, a rib RB which is a region in which the etching surface ES2 in the large surface hole and the etching surfaces ES2 in the adjacent large surface hole are connected to each other, may be positioned. Here, the rib RB may be a region in which a boundary of two adjacent large surface holes is connected. Since the rib RB is an etching surface, the rib RB may have a smaller thickness than the island portion IS. For example, the island portion may have a width of about 2 μm or more. That is, a width in a direction parallel to the other surface of a portion remaining unetched on the other surface may be about 2 μm or less. When widths of one end and the other end of one island portion IS are 2 μm or more, the total volume of the deposition mask 100 may be increased. The deposition mask 100 having such a structure ensures sufficient rigidity against a tensile force applied to an organic material deposition process or the like, and thus it may be advantageous for maintaining uniformity of the through-hole.

FIG. 21 is a view illustrating a cross-sectional view in the B-B' direction of FIG. 18 or FIG. 19. With reference to FIG. 21, the cross section of B-B' in FIGS. 18 and 19 and an enlarged cross section of a rib RB of an effective region according to FIG. 20 and a through-hole TH between the ribs RB will be described.

In the deposition mask 100 according to the embodiment, a thickness of an effective region AA in which the through-hole TH is formed by etching may be different from a thickness of an ineffective portion UA that is not etched. In detail, a thickness of the rib RB may be smaller than the thickness of the ineffective portion UA that is not etched.

In the deposition mask 100 according to the embodiment, the thickness of the ineffective portion UA may be greater than those of the effective regions AA1, AA2, and AA3. At this point, the island portion IS is a non-etched region, and the island portion IS may correspond to a maximum thickness of the ineffective portion UA or a non-deposition region NDA. For example, in the deposition mask 100, the maximum thickness of the ineffective portion UA or the non-deposition region NDA may be about 30 μm or less. Accordingly, a maximum thickness of the island portion IS may be about 30 μm or less, and the thicknesses of the effective regions AA1, AA2, and AA3 other than the island portion IS may be smaller than that of the ineffective portion UA. Specifically, in the deposition mask 100, the maximum thickness of the ineffective portion UA or the non-deposition region NDA may be about 25 μm or less. For example, in the deposition mask of the embodiment, the maximum thickness of the ineffective portion or the non-deposition region may be about 15 μm to about 25 μm. Accordingly, the maximum thickness of the island portion IS may be about 15 μm to about 25 μm. When the maximum thickness of the ineffective portion or the non-deposition region of the deposition mask according to the embodiment exceeds about 30 μm, it may be difficult to form through-holes TH having a fine size because a thickness of a metal plate 10 which is a raw material of the deposition mask 100 becomes thick. In addition, when the maximum thickness of the ineffective portion UA or the non-deposition region NDA of the deposition mask 100 is less than about 15 μm, it may be difficult to form through-holes having a uniform size because the thickness of the metal plate is thin.

A maximum thickness T3 measured at the center of the rib RB may be about 15 μm or less. For example, the maximum thickness T3 measured at the center of the rib RB may be about 7 μm to about 10 μm. For example, the maximum thickness T3 measured at the center of the rib RB may be about 6 μm to about 9 μm. When the maximum thickness T3 measured at the center of the rib RB exceeds about 15 μm, it may be difficult to form an OLED deposition pattern having a high resolution of 500 PPI or more. Further, when the maximum thickness T3 measured at the center of the rib RB is less than about 6 μm, it may be difficult to form uniformly the deposition pattern.

A height H1 of the small surface hole of the deposition mask 100 may be about 0.2 to 0.4 times the maximum thickness T3 measured at the center of the rib RB. For example, the maximum thickness T3 measured at the center of the rib RB may be about 7 μm to about 9 μm, and the height H1 between one surface of the deposition mask 100 and the communication portion may be about 1.4 μm to about 3.5 μm. The height H1 of the small surface hole of the deposition mask 100 may be about 3.5 μm or less. For example, a height of a small surface hole V1 may be about 0.1 μm to about 3.4 μm. For example, the height of the small surface hole V1 of the deposition mask 100 may be about 0.5 μm to about 3.2 μm. For example, the height of the small surface hole V1 of the deposition mask 100 may be about 1 μm to about 3 μm. Here, the height may be measured in a thickness measurement direction of the deposition mask 100, that is, in a depth direction, and may be a height measured from one surface of the deposition mask 100 to the communication portion. In detail, it may be measured in the z-axis direction forming 90 degrees to the horizontal direction (x direction) and the vertical direction (y direction) described above in the plan view of FIGS. 18 and 19.

When the height between one surface of the deposition mask 100 and the communication portion exceeds about 3.5 μm, deposition failures may occur due to a shadow effect in which a deposition material spreads to a region larger than an area of a through-hole during OLED deposition.

In addition, a hole diameter W1 at one surface in which a small surface hole V1 of the deposition mask 100 is formed and a hole diameter W2 at the communication portion which is a boundary between the small surface hole V1 and a large surface hole V2, may be similar to or different from each other. The hole diameter W1 at the one surface on which the small surface hole V1 of the deposition mask 100 is formed may be larger than the hole diameter W2 at the communication portion.

For example, a difference between the hole diameter W1 at one surface of the deposition mask and the hole diameter W2 at the communication portion may be about 0.01 μm to about 1.1 μm. For example, the difference between the hole diameter W1 at one surface of the deposition mask and the hole diameter W2 at the communication portion may be about 0.03 μm to about 1.1 μm. For example, the difference between the hole diameter W1 at one surface of the deposition mask and the hole diameter W2 at the communication portion may be about 0.05 μm to about 1.1 μm.

When the difference between the hole diameter W1 at one surface of the deposition mask and the hole diameter W2 at the communication portion is larger than about 1.1 μm, deposition failures may occur due to the shadow effect.

In addition, it is possible to have an inclination angle θ1 connecting one end E1 of the large surface hole V2 positioned on the other surface 102 opposite to the one surface 101 of the deposition mask 100 and one end E2 of the communication portion between the small surface hole V1 and the large surface hole V2. For example, the one end E1 of the large surface hole V2 may refer to a point in which a rib RB that is a boundary of a second inner side surface ES2 in the large surface hole V21 is located. The one end E2 of the communication portion may refer to an end of the through-hole TH. The inclination angle θ1 connecting the one end E1 of the large surface hole V2 and the one end E2 of the communication portion may be 40 to 55 degrees. Accordingly, the deposition pattern having a high resolution of 400 PPI or more, in detail, a high resolution of 500 PPI or more may be formed, and simultaneously, the island portion IS may exist on the other surface 102 of the deposition mask 100.

Hereinafter, with reference to FIG. 22, a method of manufacturing a deposition mask according to an embodiment will be described.

In the method for manufacturing the deposition mask of a metal material for OLED pixel deposition, the deposition mask according to the embodiment may be manufactured including: a first step of preparing a base metal plate of a thickness of 20 μm to 30 μm; a second step of disposing a patterned photoresist layer on one side of the base metal plate, forming a groove on one surface of the base metal plate by half-etching an open portion of the photoresist layer, disposing a patterned photoresist layer on the other side of the base metal plate opposite the one side, and forming a through-hole connected to the groove on the one surface of the base metal plate by etching the open portion of the photoresist layer; and a third step of removing the photoresist layer to form a deposition mask including a large surface hole formed on the one surface, a small surface hole formed on the other surface opposite to the one surface, and a through-hole formed by a communication portion to which a boundary between the large surface hole and the small surface hole is connected. Through this, it is possible to manufacture a deposition mask that may realize a resolution of 500 PPI or more.

In the method for manufacturing the deposition mask of a metal material for OLED pixel deposition, the deposition mask according to the embodiment may be manufactured including: a first step of preparing a base metal plate of a thickness of 15 μm to 20 μm; a second step of disposing a patterned photoresist layer on one side of the base metal plate, forming a groove on one surface of the base metal plate by half-etching an open portion of the photoresist layer, disposing a patterned photoresist layer on the other side of the base metal plate opposite the one side, and forming a through-hole connected to the groove on the one surface of the base metal plate by etching the open portion of the photoresist layer; and a third step of removing the photoresist layer to form a deposition mask including a large surface hole formed on the one surface, a small surface hole formed on the other surface opposite to the one surface, and a through-hole formed by a communication portion to which a boundary between the large surface hole and the small surface hole is connected. Through this, it is possible to manufacture a deposition mask that may realize a resolution of 800 PPI or more.

First, the first step of preparing a base metal plate BM having a thickness of 20 μm to 30 μm will be described.

The base metal plate BM may include a metal material. The base metal plate BM may include a nickel alloy. For example, the base metal plate BM may be an alloy of nickel and iron. At this point, the nickel may be about 35 to 37 wt %, and the iron may be about 63 to 65 wt %. For example, the base metal plate BM may include an invar including about 35 to 37 wt % of nickel, about 63 to 65 wt % of iron, and at least one of a trace amount of C, Si, S, P, Cr, Mo, Mn, Ti, Co, Cu, Fe, Ag, Nb, V, In, and Sb. Here, the small amount may mean not more than 1 w %. Specifically, here, the trace amount may refer to 0.5 wt % or less. However, the base metal plate BM is not limited thereto, and may obviously include various metal materials.

Since the nickel alloy such as invar has a small thermal expansion coefficient, it has advantage that a lifetime of the deposition mask may be increased.

Here, the first step may further include a thickness reduction step according to a target thickness of the base metal plate.

For example, the base metal plate BM may have a thickness of 25 μm to 30 μm. The base metal plate BM may have a thickness of 15 μm to 25 μm through the thickness reduction step by rolling and/or etching. Here, the etching may be included electrical or chemical etching.

The base metal plate BM or the base metal plate BM that has undergone a thickness reduction step may optionally include a surface treatment step.

For example, there is a problem that uniform etching for the nickel alloy such as the invar is difficult. That is, in the nickel alloy such as the invar, the etch rate may be increased in an initial stage of the etching. Accordingly, there is a problem that the etching factor of the small surface hole may be lowered. When the etching factor of the small surface hole is lowered, there may be a problem that a deposition mask may be formed in which deposition failures occur due to the shadow effect. Alternatively, de-filming of the photoresist layer may occur due to side etching of the large surface hole. In addition, it may be difficult to form a through-hole having a fine size as a size of the through-hole increases. Further, the through-hole is formed non-uniformly, so that a yield of the deposition mask may be lowered.

Therefore, in an embodiment, a surface layer for surface modification may be disposed on a surface of the base metal plate with different composition, content, crystal structure and corrosion rate. Here, the surface modification may mean a layer made of various materials disposed on the surface to improve an etching factor.

That is, a surface treatment layer may be a layer for preventing rapid etching on the surface of the base metal plate. The surface treatment layer may be an etching barrier layer having a lower etch rate than that of the base metal plate. The surface treatment layer may have a different crystal plane and crystal structure from those of the base metal plate. For example, as the surface treatment layer includes a different element from that of the base metal plate, a crystal plane and a crystal structure may be different from each other.

In the same corrosion environment, the surface treatment layer may have a different corrosion potential from that of the base metal plate. For example, when the same etchant is applied for the same time at the same temperature, the surface treatment layer may have different corrosion currents or corrosion potentials from those of the base metal plate.

The base metal plate BM may include a surface treatment layer or a surface treatment portion on one surface and/or both surfaces, the entire surface, and/or an effective region thereof. The surface treatment layer or the surface treatment portion may include different elements from the base metal plate, or may include a metal element having a slow corrosion rate in a larger content than the base metal plate.

For example, the surface treatment layer may include at least one metal of nickel (Ni), chromium (Cr), iron (Fe), titanium (Ti), manganese (Mn), oxygen (O), molybdenum (Mo), silver (Ag), zinc (Zn), nitrogen (N), aluminum (Al) and alloys thereof, and a content of at least one metal of nickel (Ni), chromium (Cr), iron (Fe), titanium (Ti), manganese (Mn), oxygen (O), molybdenum (Mo), silver (Ag), zinc (Zn), nitrogen (N), aluminum (Al) and alloys thereof may be greater than that of the base metal plate.

In case of further including such a surface treatment step, the surface treatment layer may be disposed on a surface of the base metal plate according to the embodiment. In the surface treatment step, the surface treatment layer of the element different from the base metal plate BM is disposed, so that the corrosion rate on the surface may be slower than that of a raw material of the base metal plate BM. Accordingly, the etching factor of the deposition mask according to the embodiment may be increased. In addition, since the deposition mask according to the embodiment may uniformly form a plurality of through-holes, the deposition efficiency of R, G, and B patterns may be improved. Here, including different elements may mean that the base metal plate BM and the surface treatment layer include at least one different element, or even though all the elements are the same, alloys having different contents are included.

Next, a disposing step of a patterned photoresist layer PR1 on one surface of the base metal plate will be described. The patterned photoresist layer PR1 may be disposed on one surface of the base metal plate in order to form a small surface hole. An etching barrier layer such as a coating layer or a film layer for preventing etching may be disposed on the other surface opposite to one surface of the base metal plate.

Next, the second step of forming a groove on one surface of the metal plate by half-etching an open portion of the photoresist layer PR1 will be described.

The open portion of the photoresist layer PR1 may be exposed to an etchant or the like, and thus etching may occur in an open portion of one surface of the base metal plate on which the photoresist layer PR1 is not disposed.

The second step may be a step of etching the base metal plate having a thickness T1 of about 20 μm to about 30 μm to a thickness of about ½. A depth of the groove formed by the second step may be about 10 μm to 15 μm. That is, a thickness T2 of the base metal plate measured at the center of the groove after the second step may be about 10 μm to 15 μm.

The second step may be an anisotropic etching or semi additive process (SAP). In detail, the anisotropic etching or semi additive process may be used to half-etch the open portion of the photoresist layer. Accordingly, in the groove formed by the half-etching, an etch rate (b direction) in a depth direction may be faster than that of the side etching (a direction) than an isotropic etching.

An etching factor of the small surface hole may be 2.0 to 3.0. For example, the etching factor of the small surface hole may be 2.1 to 3.0. For example, the etching factor of the small surface hole may be 2.2 to 3.0.

Here, the etching factor may mean that a depth B of an etched small surface hole divided by a width A of the photoresist layer extending from the island portion on the small surface hole and protruding toward the center of the through-hole (Etching Factor=B/A). The A may mean an average value of a width of one side of the photoresist layer protruding on the one surface hole and a width of the other side opposite to the one side.

Next, a forming step of the through-hole will be described.

First, a patterned photoresist layer PR2 may be disposed on the other surface opposite to the one surface of the base metal plate. The patterned photoresist layer PR2 having an open portion may be disposed on the other surface opposite to the one surface of the base metal plate in order to form a large surface hole. An etching barrier layer such as a coating layer or a film layer for preventing etching may be disposed on one surface of the base metal plate.

The open portion of the photoresist layer PR2 may be exposed to an etchant, and thus etching may occur in an open portion of the other surface of the base metal plate on which the photoresist layer PR2 is not disposed. The other surface of the base metal plate may be etched by anisotropic etching or isotropic etching.

The open portion of the photoresist layer is etched, and thus the groove on one surface of the metal plate may be connected to the large surface hole to form a through-hole.

In the second step, 1) the patterned photoresist layer PR1 is disposed on one surface of the base metal plate and the patterned photoresist layer PR2 is disposed on the other surface of the base metal plate. And then, 2) the through-hole may be formed by etching one surface and the other surface of the base metal plate at the same.

Alternatively, in the second step, 1) the patterned photoresist layer PR1 may be disposed on one surface of the base metal plate, and 2) the grove may be formed on only one surface of the base metal plate by half-etching the open portion of the photoresist layer PR1. Then, 3) the patterned photoresist layer PR2 may be disposed on the other surface of the base metal plate. And then 4) the through-hole may be formed on the other surface of the base metal plate by etching the open portion of the photoresist layer PR2.

Alternatively, in the second step, 1) the patterned photoresist layer PR2 may be disposed on the other surface of the base metal plate, and 2) the large surface hole may be formed on only the other surface of the base metal plate by etching the open portion of the photoresist layer PR2. Then, 3) the patterned photoresist layer PR1 may be disposed on the one surface of the base metal plate. And then 4) the through-hole connected to the large surface hole may be formed on the one surface of the base metal plate by half-etching the open portion of the photoresist layer PR1.

Next, the deposition mask may be formed through the third step of forming the deposition mask including the large surface hole formed on the one surface, the small surface hole formed on the other surface opposite to the one surface, and the through-hole formed by the communication portion to which the boundary between the large surface hole and the small surface hole is connected.

A deposition mask 100 formed through the third step may include the same material as the base metal plate. For example, the deposition mask may include a material having the same composition as the base metal plate. For example, the island portion of the deposition mask may include the surface treatment layer described above.

In the deposition mask formed through the third step, a maximum thickness at the center of the rib may be smaller than a maximum thickness at an ineffective region not subjected to etching. For example, the maximum thickness at the center of the rib may be 15 μm. For example, the maximum thickness at the center of the rib may be less than 10 μm. However, a maximum thickness in an ineffective region of the deposition mask may be 20 μm to 30 μm. The maximum thickness in the ineffective region of the deposition mask may be equal to a thickness of the base metal plate prepared in the first step. Alternatively, the maximum thickness in the ineffective region of the deposition mask may be 15 μm to 25 μm after a thickness reduction step in the first step.

With reference to FIGS. 23 and 24, a deposition pattern formed by a deposition mask according to an embodiment will be described.

Referring to FIG. 23, in a deposition mask according to an embodiment, a height H1 between one surface of the deposition mask in which a small surface hole is formed and a communication portion may be about 3 μm or less. Accordingly, a distance between one surface of the deposition mask and a substrate on which a deposition pattern is disposed may be short, and thus deposition failures due to a shadow effect may be reduced.

Referring to FIG. 24, deposition failures that different deposition materials are deposited in the same region in a region between two adjacent patterns of adjacent R, G, and B patterns may not occur. That is, R, G, and B patterns according to an embodiment may minimize a shadow phenomenon in which a deposition material spreads around the patterns. Therefore, in the deposition mask according to the embodiment, a height of a small hole diameter may be 3 μm or less, and thus it is possible to prevent a failure of OLED pixel deposition.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

The above description of the embodiments is merely examples and does not limit the present invention. It would be apparent to those of ordinary skill in the art that the present invention may be easily embodied in many different forms without changing the technical idea or essential features thereof. For example, elements of the exemplary embodiments described herein may be modified and realized. Also, it should be construed that differences related to such changes and applications are included in the scope of the present invention defined in the appended claims.

What is claimed is:

1. A deposition mask including an iron (Fe) and a nickel (Ni) of metal materials for OLED pixel deposition, wherein the deposition mask comprises a metal plate including an iron (Fe)-nickel (Ni) alloy,
   wherein the metal plate comprises a deposition region and a non-deposition region other than the deposition region for forming a deposition pattern, wherein the deposition region includes a plurality of effective portions and an ineffective portion other than the effective portions, wherein one of the effective portions includes:
   a plurality of small surface holes formed on one surface of the deposition mask;
   a plurality of large surface holes formed on another surface of the deposition mask opposite to the one surface;
   a plurality of through-holes communicating the small surface holes and the large surface holes of the deposition mask; and
   an island portion formed on the other surface of the deposition mask, and disposed between the plurality of through-holes,
   wherein the metal plate is formed of a plurality of crystal grains, and a maximum area of the crystal grains measured over an entire area of the metal plate is 700 $\mu m^2$ or less, and wherein when measuring from small crystal grains in all crystal grains measured over the entire area of the metal plate, a maximum area of 95% of the small crystal grains is 60 $\mu m^2$ or less.

2. The deposition mask of claim 1, wherein a quantity per unit area of the plurality of crystal grains is 0.20 ea/$\mu m^2$ to 0.25 ea/$\mu m^2$.

3. The deposition mask of claim 2, wherein for the quantity of crystal grains per unit area, an area of 1 μm*1 μm was defined as the unit area after measuring a number of entire crystal grains in an area of 300 μm*300 μm out of the surface of the entire metal plate, and the quantity of crystal grains per unit area was measured.

4. A deposition mask including an iron (Fe) and a nickel (Ni) of metal materials for OLED pixel deposition, wherein the deposition mask comprises a metal plate including an iron (Fe)-nickel (Ni) alloy,
   wherein the metal plate comprises a deposition region and a non-deposition region other than the deposition region for forming a deposition pattern,
   wherein the deposition region includes a plurality of effective portions and an ineffective portion other than the effective portions, wherein one of the effective portions includes:
   a plurality of small surface holes formed on one surface of the deposition mask;
   a plurality of large surface holes formed on another surface of the deposition mask opposite to the one surface;
   a plurality of through-holes communicating the small surface holes and the large surface holes of the deposition mask; and
   an island portion formed on the other surface of the deposition mask, and disposed between the plurality of through-holes,
   wherein the metal plate is formed of a plurality of crystal grains, and a maximum area of the crystal grains measured over an entire area of the metal plate is 700 $\mu m^2$ or less, and wherein a maximum particle diameter of the crystal grains measured in the entire area of the metal plate is 30 μm or less.

5. The deposition mask of claim 4, wherein the particle diameter of the crystal grain is measured by the following Equation.

$$2*\sqrt{area/\pi}$$

6. The deposition mask of claim 4, wherein a quantity per unit area of the plurality of crystal grains is 0.20 ea/μm² to 0.25 ea/μm².

7. The deposition mask of claim 6, wherein for the quantity of crystal grains per unit area, an area of 1 μm*1 μm was defined as the unit area after measuring a number of entire crystal grains in an area of 300 μm*300 μm out of the surface of the entire metal plate, and the quantity of crystal grains per unit area was measured.

8. A deposition mask including an iron (Fe) and a nickel (Ni) of metal materials for OLED pixel deposition, wherein the deposition mask comprises a metal plate including an iron (Fe)-nickel (Ni) alloy,
wherein the metal plate comprises a deposition region and a non-deposition region other than the deposition region for forming a deposition pattern,
wherein the deposition region includes a plurality of effective portions and an ineffective portion other than the effective portions, wherein one of the effective portions includes:
a plurality of small surface holes formed on one surface of the deposition mask;
a plurality of large surface holes formed on another surface of the deposition mask opposite to the one surface;
a plurality of through-holes communicating the small surface holes and the large surface holes of the deposition mask; and
an island portion formed on the other surface of the deposition mask, and disposed between the plurality of through-holes,
wherein the metal plate is formed of a plurality of crystal grains, and a maximum area of the crystal grains measured over an entire area of the metal plate is 700 μm² or less, and wherein when measuring from small crystal grains in all crystal grains measured over the entire area of the metal plate, a maximum particle diameter of 95% of the small crystal grains is 9 μm or less.

9. The deposition mask of claim 8, wherein a quantity per unit area of the plurality of crystal grains is 0.20 ea/μm² to 0.25 ea/μm².

10. The deposition mask of claim 9, wherein for the quantity of crystal grains per unit area, an area of 1 μm*1 μm was defined as the unit area after measuring a number of entire crystal grains in an area of 300 μm*300 μm out of the surface of the entire metal plate, and the quantity of crystal grains per unit area was measured.

* * * * *